United States Patent [19]

Rostoker et al.

[11] Patent Number: 5,563,928
[45] Date of Patent: *Oct. 8, 1996

[54] METHOD AND APPARATUS FOR OPTIMIZING THE PERFORMANCE OF DIGITAL SYSTEMS

[75] Inventors: Michael D. Rostoker, Boulder Creek, Calif.; Daniel J. Lincoln, Bowie, Md.

[73] Assignee: LSI Logic Corporation, Milpitas, Calif.

[ * ] Notice: The term of this patent shall not extend beyond the expiration date of Pat. No. 5,438,599.

[21] Appl. No.: 441,542

[22] Filed: May 15, 1995

Related U.S. Application Data

[63] Continuation-in-part of Ser. No. 129,913, Sep. 30, 1993, Pat. No. 5,438,599.
[51] Int. Cl.$^6$ .................................................. H01L 25/00
[52] U.S. Cl. ................. 377/20; 377/25; 327/42; 327/513; 327/365; 327/156
[58] Field of Search ................ 327/42, 513, 564–5, 327/156; 377/25, 20

[56] References Cited

U.S. PATENT DOCUMENTS

| | | | |
|---|---|---|---|
| 5,359,234 | 10/1994 | Atriss et al. ............................. | 377/25 |
| 5,388,134 | 2/1995 | Douglass et al. ......................... | 377/25 |
| 5,438,599 | 8/1995 | Lincoln .................................... | 377/20 |
| 5,442,669 | 8/1995 | Medin ..................................... | 377/25 |

*Primary Examiner*—Margaret Rose Wambach
*Attorney, Agent, or Firm*—Katz & Cotton, L.L.P.

[57] ABSTRACT

A free running relaxation oscillator is disposed on a semiconductor integrated circuit die for generating a frequency representative of the natural frequency of the die. The natural frequency of the die changes for different operating temperatures and voltages. An optimal speed may be determined at which the die will reliably operate by measuring the natural frequency. The die may be effectively graded and matched with a similar die by correlating the natural frequency of the die with the temperature and voltage values at which the natural frequency was measured for each die. A plurality of integrated circuit dice may be connected into a digital system, and the natural frequencies of each die may be monitored so as to optimize the system operating speed, reduce system power consumption without degrading performance, and/or increase the operating speed of a slower die by changing the temperature and/or operating voltage thereof.

50 Claims, 13 Drawing Sheets

METHOD AND APPARATUS FOR OPTIMIZING THE PERFORMANCE OF DIGITAL SYSTEMS

CROSS REFERENCE TO RELATED PATENT APPLICATION

This patent application is a continuation-in-part of U.S. patent application Ser. No. 08/129,913, filed Sep. 30, 1993, entitled "SELF-CALIBRATION TIMING CIRCUIT" by Daniel Lincoln, now U.S. Pat. No. 5,438,599 issued Sep. 30, 1993, and which is hereby incorporated by reference for all purposes.

BACKGROUND OF THE INVENTION

1. Field of the Invention

The present invention relates to digital electronic systems and, more particularly, to a method and apparatus for optimizing the performance of the digital systems by determining optimal speed-power parameters for the components of the digital systems.

2. Description of the Related Technology

Semiconductor integrated circuits may be fabricated on, for example, a silicon wafer. There may, however, be a wide variance in the maximum reliable operating speed of the integrated circuits from one silicon wafer to another depending on variations in materials used and process variations during fabrication. Thus, performance, even among the same type of integrated circuit from the same manufacturer, may vary widely in operational speed performance by a factor of as much as 375 percent or more, from slowest to fastest operating speed. This wide range of operating speeds from the process lot variations during fabrication of the integrated circuit wafers also results in integrated circuit parameter variations caused by varying operating temperatures and voltages of the integrated circuits in a system.

Such wide variance in operating speed range typically causes timing problems when trying to design and interface between different semiconductor integrated circuits in a digital electronic system. Critical timing parameters are, for example, set up and hold requirements, and maximum usable clock speed. System circuit designs must also take into account worst-case operating conditions resulting from high and low voltages, and temperature extremes. Manufacturers typically guarantee operating speed parameters that may be much slower than the actual integrated circuits are capable of because worst-case operating conditions must always be considered or met. This results in a loss of potential performance when using the integrated circuits in an electronic system.

Electronic systems are used widely in diverse applications that have both wide variations in temperature and voltage. Reliability of an electronic system also demands that all components of the system operate within an acceptable performance specification. Mission critical applications of electronic systems in space satellites, weapons, industrial control, telecommunications, transportation, and financial data processing demand the most reliable, yet fastest and most efficient operation of the electronic system.

What is needed is a method and apparatus which automatically and continuously senses the relative performance of at least one integrated circuit during its operation in a system, and allows the operating speed, voltage, and/or temperature of the at least one integrated circuit to be adjusted for best system performance.

SUMMARY OF THE INVENTION

The present invention provides a method and apparatus for obtaining substantially optimal performance from at least one semiconductor integrated circuit utilized in an electronic system. When a plurality of integrated circuits are utilized together, the slowest integrated circuit will operate at its maximum performance speed, and the faster operating integrated circuits will adjust to the requirements of the slowest integrated circuit. In addition, the operating parameters (such as voltage and temperature) of the faster integrated circuits may be adjusted to reduce power consumption and/or operating temperature.

An object of the present invention is to determine optimal performance parameters of the at least one integrated circuit operating in a system over a wide range of temperatures and voltages encountered, and to compensate for operating parameter differences between a plurality of integrated circuits operating together in a system.

Another object is to effectively grade semiconductor integrated circuits according to their operating speed.

Yet another object is determine the operating speed parameters of an integrated circuit over a range of operating voltages and temperatures.

Still another object of the present invention is to operate a digital system at an optimal clock speed.

Another object is to maintain an optimal operating speed of a digital system over a wide range of temperature and voltage conditions.

A further object is the ability to reduce the power consumption of a digital system operating at a desired speed by reducing the system operating voltage to a value where the digital system still reliably runs at the desired speed.

It is contemplated that the method and apparatus of the present invention may be utilized in system level products comprising single chip modules (SCM) often including other electrical components (such as capacitors, resistors, inductors, etc.); multi-chip modules (MCM) having at least two integrated circuit die in the same or separate packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital data storage; security and surveillance systems, general purpose computers (such as personal computers, work stations, servers, mini computers, mainframe computers and super computers); digital audio and video compression and transmission; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications (such as PBX, telephone switching, voice mail, auto attendant, network controllers, video teleconferencing, digital data transmission (such as token ring, ethernet, ATM, or the like), and subsystems or subassemblies for inclusion or attachment to more complex system level products.

According to the present invention, a "self-calibration timing circuit" is utilized for determining dynamic performance of at least one, but preferably each integrated circuit over its operating range while functioning in the system. The present invention accomplishes this by measuring the free running frequencies of the self-calibration timing circuits residing on those integrated circuits having such self-calibration utilized in the system. The self-calibration timing circuit consists of a relaxation oscillator fabricated on the semiconductor integrated circuit die. In addition, a gated counter, a fixed reference oscillator and a decision circuit for determining the current operating parameters of the integrated circuit may be fabricated on the die or be separate circuits. A preferred embodiment of the self-calibration timing circuit is described in commonly owned U.S. patent application Ser. No. 08/129,913, filed Sep. 30, 1993, entitled "SELF-CALIBRATION TIMING CIRCUIT" by Daniel Lincoln, now U.S. Pat. No. 5,438,599, issued Sep. 30, 1963, and which is hereby incorporated by reference for all purposes.

Implementation of the self-calibration timing circuit on each semiconductor integrated circuit allows automatic and continuous sensing of the performance of each of the integrated circuits utilized in the system. In addition, monitoring of each of the integrated circuit's operating parameters (voltage and temperature) enables the calculation and any necessary compensation of the system parameters to be applied in real time. Thus, parameter compensation may be applied to the system for optimal operating speed and/or power consumption without jeopardizing system reliability or data integrity. Valuable, but lesser advantages will be obtained so long as the system has one or more semiconductor integrated circuits with a self-calibration timing circuit.

In a preferred embodiment of the self-calibration timing circuit, a reference generator oscillates at the free running or relaxation frequency of the integrated circuit silicon die which is the natural speed of the silicon in its operating environment. The relaxation frequency is determined by the inherent propagation delays and device parameters of the transistor circuits embodied in the silicon die.

The relaxation frequency of each of the integrated circuits is determined by a frequency measuring device such as a frequency counter. The measured relaxation frequencies of the integrated circuits in the system are compared in a digital logic circuit which determines the optimal system clock frequency that may be safely utilized without degrading system performance or reliability, i.e., the system clock runs no faster than what the slowest integrated circuit can reliably operate.

A preferred embodiment of the present invention may utilize, in addition to the frequency counters, a microprocessor for the digital logic circuit. The term "microprocessor" includes, but is not limited to, any circuits (such as a microcontroller, PLA, ASIC, logic circuits disposed onto the integrated circuit itself, or the like) that monitor, control and may calculate parameters. The microprocessor monitors the relaxation frequencies of the integrated circuits, and may also monitor the voltages and temperatures of each integrated circuit. Herein defined, where "each" is noted, such term refers to each integrated circuit having a self calibration timing circuit, or to a smaller subset of one or more such integrated circuits which may be considered as a subgroup.

It is contemplated and within the scope of the present invention that a very large scale (VLSI) integrated circuit die may have a plurality of relaxation oscillators at different locations (functional core blocks) on the die, and that each functional core block of the die may be monitored for optimal performance. The die clock may be adjusted for the slowest functional core block so as to maintain maximum die operating speed consistent with reliability and data integrity.

It is also contemplated that the present invention may be utilized in a large digital system requiring synchronous operation at a maximum reliable clock speed. Different subsystems of this system may be located at diverse locations and environmental extremes. An advantage of the present invention is that the a digital system may always run at maximum speed for all operating conditions without having to derate the system components for worst case operating conditions.

Another embodiment of the present invention facilitates selection and grading of semiconductor integrated circuits by measuring the relaxation frequency of each integrated circuit over an operating range of different temperatures and voltages. Matching of similar performance integrated circuits may be easily done once an operating speed profile for each integrated circuit is compiled.

Yet another embodiment of the present invention utilizes a power saving feature of reducing the voltage on selected integrated circuits in a system. When the natural relaxation frequency of an integrated circuit is much faster than necessary for proper system performance, that integrated circuit's parameters may be adjusted to reduce its power consumption and thus the heat generated therefrom. Significant power reduction of and heat generation by the integrated circuit may be obtained by reducing the voltage on the integrated circuit with a corresponding reduction in current drawn. For example, this may benefit battery powered systems such as portable computers, cellular telephones, etc.

The present invention may be implemented in a system as follows. An initialization circuit synchronizes the self-calibration relaxation oscillator (on the silicon die) "reference generator" and an external or internal system clock to a gated counter which quantizes the ratio of the reference generator frequency to the system clock frequency. The gated counter counts the number of relaxation frequency cycles during one or more system clock periods. Since the gated counter is synchronized by the fixed (generally, i.e., external to that integrated circuit die) external system clock, an accurate and repeatable count is obtained. The aforementioned ratio value is thus the number of reference generator cycles counted during the one or more system clock periods. As an example, 10 reference generator cycles counted during one system clock period will result in a ratio value of 10.

The ratio value (reference generator frequency divided by the system clock frequency) is then utilized to determine the speed at which the integrated circuit is capable of reliably running, based upon functional values, such as technology library parameters and device layout. It is important to note that with well characterized library elements and accurate back-annotation from layout design, the range of expected relaxation frequencies can be accurately anticipated for any generic semiconductor technology. Thus, the present invention may be applied without requiring the creation of special functional cells.

With this information, the system clock may be varied for optimum system performance and reliability. Through circuit testing and/or computer simulations, an optimal ratio for best circuit performance and reliability may be easily obtained. From this optimal ratio, better control of system performance and reliability may be derived for all temperature, voltage and fabrication process variations of the semiconductor integrated circuits making up the system.

In one aspect of the invention, a decision circuit evaluates the values of the ratio of the reference generators to system clock frequencies and determines the optimal system clock speed for the at least one integrated circuit of the system. In this way, the system clock speed can be set so it cannot exceed the operating speed capabilities of the slowest functional integrated circuit in the system. In addition, a variably higher system clock speed may be utilized if/when a "slow" component in the system is not being used for a particular function or operation. This also is true when a non-critical integrated circuit or subpart (core logic) of the integrated circuit is slower but its operation would affect the overall system operation during a particular system function or operation, i.e., a serial communications interface is not operationally critical for data transfer between a disk controller and a central processing unit of a computer system.

An advantage of the present invention is that a semiconductor integrated circuit such as a microprocessor may run as fast as possible without having to maintain a slow speed based upon an expected worst-case environment. The faster the microprocessor runs, the faster the software system performs its functions. Thus, for a given environment, a computer system may have higher performance at lower cost than is presently possible. In addition, optimal system performance may be maintained over a wide range of temperatures and voltages. This is especially important in space satellites and space craft which operate in the extreme temperature ranges of space. For example, The physics of a silicon based complementary metal oxide semiconductor ("CMOS") device does not support the same speed performance when operating at elevated temperatures as it would when operating at lower (cooler) temperatures. Thus, a speed reduction of the system clock may be appropriate for proper operation when the CMOS device is operated at elevated temperatures.

Heretofore, the system clock had to substantially remain at the lower speed setting throughout the extremes of temperature found in outer space. The present invention allows a system speed improvement at least as large as the silicon speed range.

Still another feature of the present invention is that the clock ratio may be utilized to sort out different grades of semiconductor devices during testing based on speed of operation. The relaxation oscillator need only be implemented on the semiconductor die. The gated counter and speed decision circuitry may be implemented in the test system.

Another feature is for indicating semiconductor die device speed values for adjusting interface timing parameters for proper operation between different speed devices.

Yet another feature of the present invention is that the temperature of the integrated circuit(s) may be controlled to maintain maximum operating speed.

Still another feature is to monitor the performance of the semiconductor integrated circuit in a system while operating over a wide range of temperature and voltage conditions. Deviation from an expected norm may be predictive of system component degradation or system operation beyond a desired tolerance range.

Other and further objects, features and advantages will be apparent from the following description of presently preferred embodiments of the invention, given for the purpose of disclosure and taken in conjunction with the accompanying drawing figures.

DETAILED DESCRIPTION OF PREFERRED EMBODIMENTS

Figure 1:
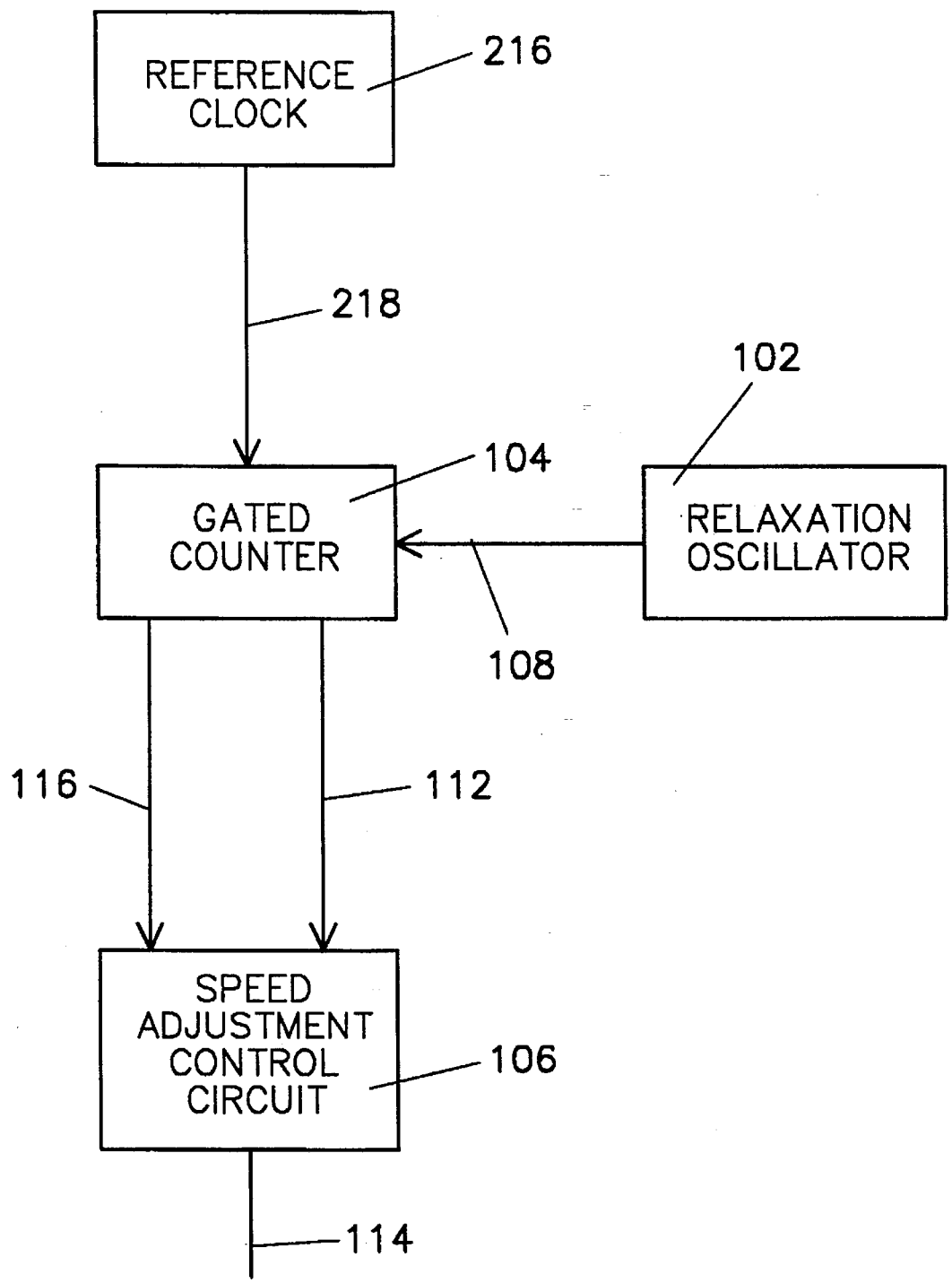
FIG. 1 is a schematic block diagram of an aspect of the present invention.

Referring now to the drawings, the details of preferred embodiments are schematically illustrated. Like elements are numbered the same, and similar elements are represented by the same number and a different lower case letter suffix.

Referring now to FIG. 1, a schematic block diagram of an aspect of the present invention is illustrated. A relaxation oscillator 102, a gated counter 104 and a speed adjustment control circuit 106 are component parts of the present invention. The relaxation oscillator 102 oscillates at the natural speed of the silicon in the environment in which it is fabricated and the associated connection path delays due to layout capacitance. A frequency output 108 from the relaxation oscillator 102 connects to the count input of the gated counter 104. The counter 104 also utilizes the system clock 110 as an input for synchronization and gating. Any type of frequency determining circuit may be utilized such as a frequency counter for determining the frequency of the relaxation oscillator 102.

The gated counter 104 quantizes the ratio of the frequency output 108 and reference clock 216 by counting the number of cycles of the frequency output 108 during a period of the clock 216 frequency. As the natural speed of the silicon changes during environmental extremes such as hot to cold, the ratio will run from low to high, respectively. When the ratio is high, a high count signal 112 may be sent to the speed adjustment control circuit 106. Conversely, when the ratio is low, a low count signal 116 is sent to speed adjustment control circuit 106. Fast/slow decision circuit 106 may be utilized to control a system clock speed by means of speed adjustment output 114. When there is a high ratio, the system clock speed is increased and when there is a low ratio, the system clock speed is decreased. Signals 112 and 116 also allow the speed adjustment control circuit 106 to assert delay elements in a controlled manner to satisfy input setup and hold times for proper interface timing.

Multiple clock speeds may be controlled by monitoring multiple bits of information from the gated counter. The actual quantized ratio value may be read from the individual stage outputs (not illustrated) of the gated counter 104, and the ratio value may be utilized to determine the selection of an appropriate system clock speed.

Figure 2:
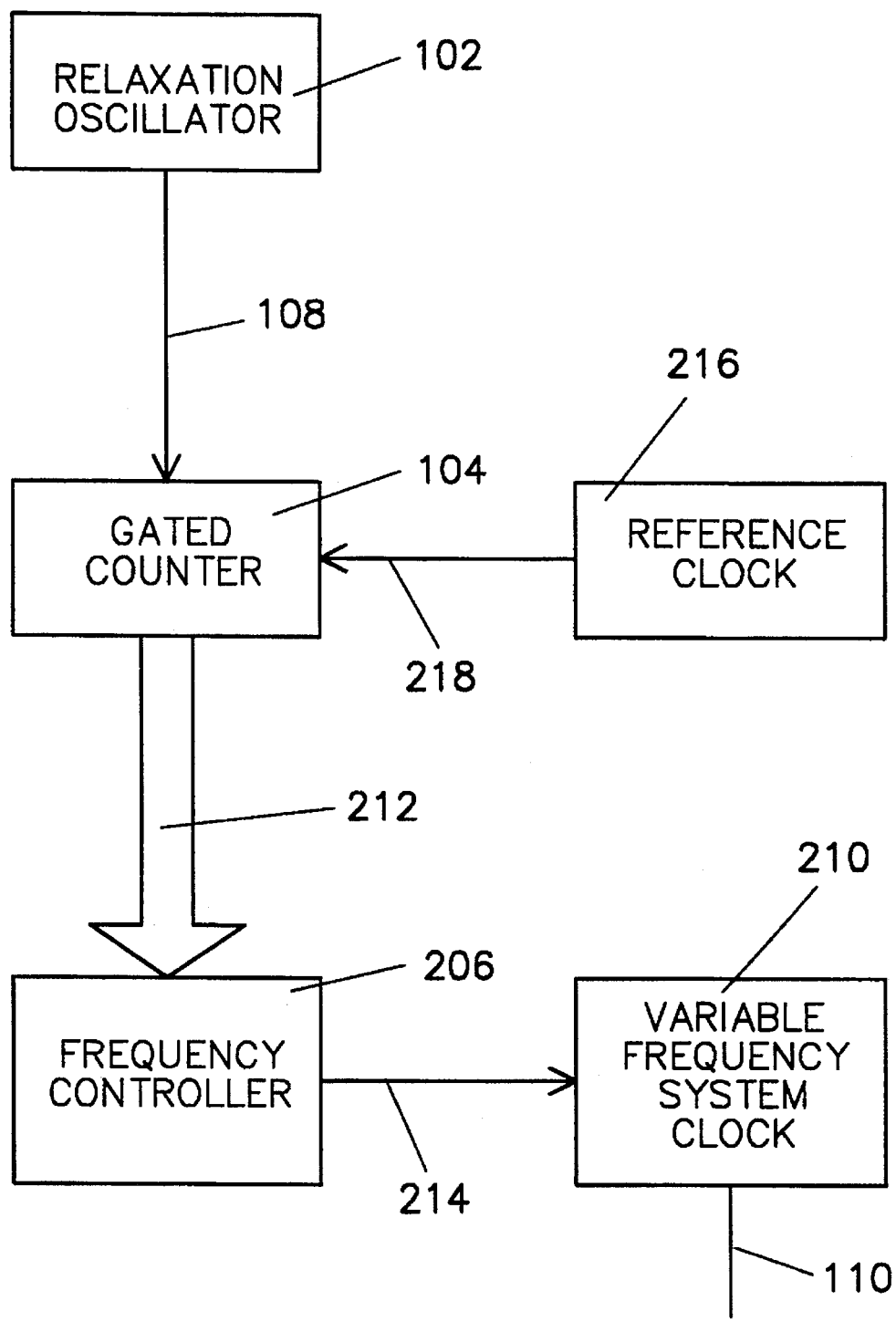
FIG. 2 is a schematic block diagram of an embodiment of the present invention.

Referring now to FIG. 2, a block diagram of an embodiment of the present invention is illustrated. The relaxation oscillator 102 frequency output 108 connects to the count input of the gated counter 104. A fixed frequency reference clock 216 is utilized as a time base reference for the gated counter 104. An output 218 of the clock 216 connects to the gated counter 104 for synchronization and gating thereof.

The gated counter 104 quantizes the ratio of the relaxation oscillator 102 and reference clock 216 frequencies by counting the number of cycles of the signal on relaxation output 108 during a period of the signal on output 218. The quantized ratio value is available on output bus 212. The output bus 212 connects to a frequency controller 206 which utilizes the quantized ratio to determine the optimal frequency of a variable frequency system clock 210.

The system clock 210 may utilize, for example, a phase lock loop, direct digital synthesis, programmable frequency division, or any other means for generating a variable frequency known by those skilled in the art of frequency generation techniques.

The frequency controller 206 controls the variable frequency system clock 210 through control signal 214. Frequency controller 206 causes the clock 210 to change frequency based upon the quantized ratio on the output bus 212. Thereafter, the frequency controller 206 and clock 210 may maintain the desired ratio throughout the temperature and voltage operating ranges of the system. In this way, the system always maintains optimal performance though extreme temperature and voltage variations encountered during system operation.

Relaxation Oscillator

Figure 3:
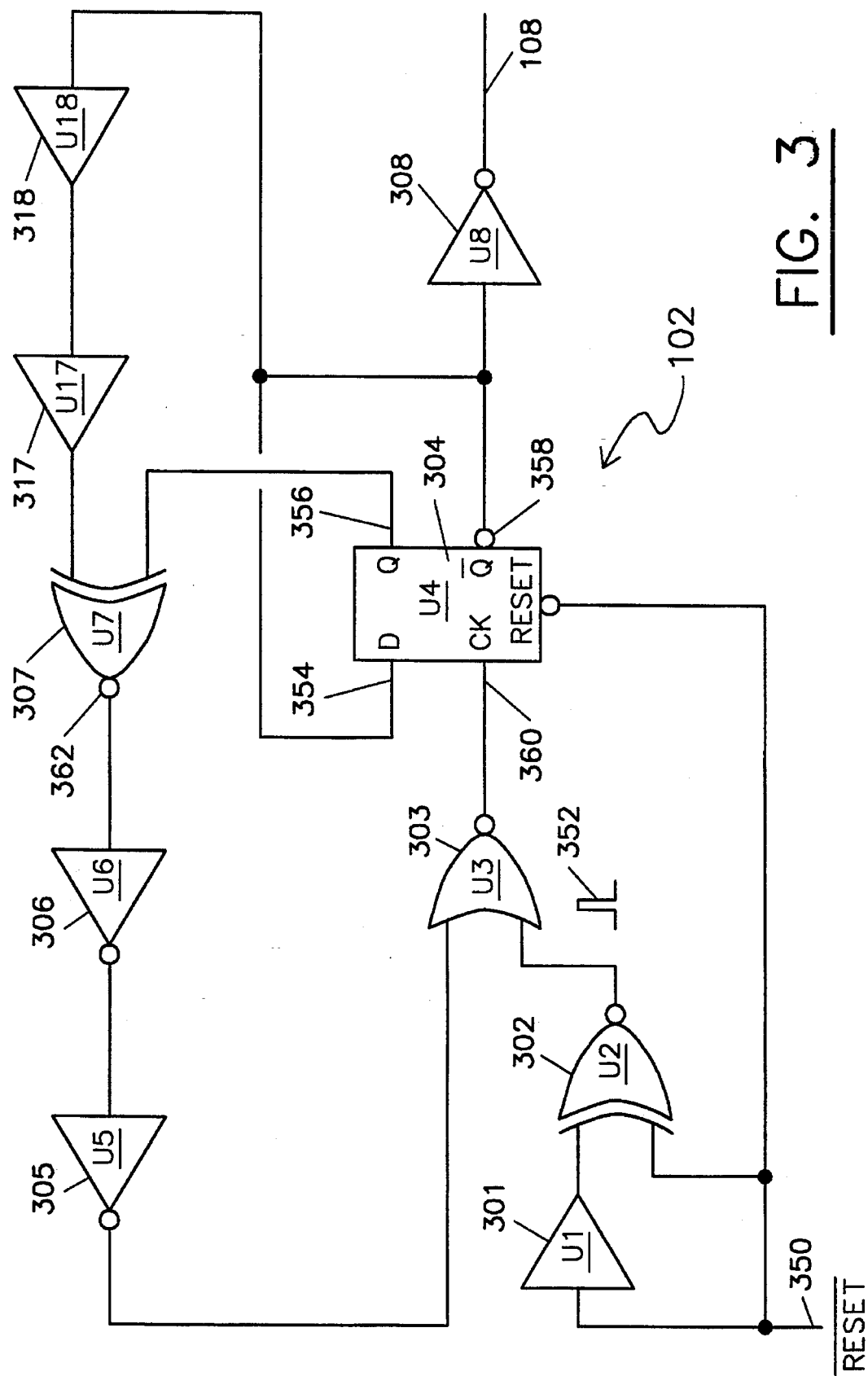
FIG. 3 is a schematic diagram of a preferred embodiment of a relaxation oscillator of the present invention.

Referring to FIG. 3, a schematic diagram of a digital logic embodiment of the relaxation oscillator 102 (FIGS. 1 and 2) is illustrated. The relaxation oscillator 102 consists of D flip-flop 304; buffers 301, 317 and 318; inverting buffers 305, 306 and 308; exclusive OR ("XOR") gate 302; exclusive NOR ("XNOR") gate 307; and NOR gate 303. The relaxation oscillator 102 may be fabricated on the semiconductor die with the same type of transistors that are used for the other circuits thereof.

A reset signal 350 is normally in the logic high or logic "1" state and connects to the input of buffer 301, one input of the XOR gate 302 and the reset input of the flip-flop 304. To initialize the relaxation oscillator 102, the reset signal 350 is briefly brought to a logic low or logic "0" state, then returned to its normally high state. Upon return of the reset signal 350 to a logic 1, a pulse 352 is generated at the output of the XOR gate 302. The pulse 352 is substantially the width in time of the delay introduced by buffer 301 because the XOR gate 302 only outputs a logic 1 when both of its inputs are of different logic states.

Flip-flop 304 is reset by the reset signal 350 to a known state, for example, the Q output at logic 0 and the Q-bar output 358 at logic 1. The output of the NOR gate 303 is connected to the clock input 360 of flip-flop 304. The pulse 352 causes the output of the NOR gate 303 to go to a logic 0 then to a logic 1 which causes the flip-flop 304 to transfer the logic value at its D input 354 to its Q output 356. The logic level at the D input 354 is the value of the Q-bar output 358 which is the opposite logic level of the Q output 356. Thus, the Q output 356 changes logic states every time a pulse is received at the clock input 360.

The Q output 356 connects to an input of the XNOR gate 307. The other input of the XNOR gate 307 connects to an output of series connected buffers 317 and 318. The input of buffer 318 connects to the Q-bar output 358. The output of the XNOR gate 307 is at a logic 0 whenever its inputs are at different logic levels. Normally, the Q output 356 and Q-bar output 358 are at different logic levels, however, these outputs change state every clock input 360. During this transition, the Q-bar output 358 logic level change is delayed to the input of the XNOR gate 307 by the series connected buffers 317 and 318. This delay causes the same logic level to briefly exist on both the inputs of the XNOR gate 307. When both inputs of the XNOR gate 307 are the same, the output 362 of the XNOR gate 307 goes to a logic 1.

The output 362 is delayed through inverting buffers 305 and 306. The output of the buffer 305 is connected to an input of the NOR gate 303. Whenever at least one input of NOR gate is at a logic 1, its output will be at logic 0. The NOR gate input is connected to the output of XOR gate 302 which is normally at logic 0 unless the reset signal 350 is asserted. Therefore, whenever both inputs of NOR gate 303 are at logic 0, its output will go to a logic 1. The NOR gate 303 output is connected to the clock input 360 of flip-flop 304. Inverting buffer 308 is utilized to buffer the frequency output 108 and is connected to the count input of the gated counter 104 (FIG. 2).

The above described circuit is a relaxation oscillator that has a frequency determined by the natural speed of the silicon in the environment in which it is fabricated and the associated connection path delays due to layout capacitance. The above circuit illustrated in FIG. 3 will oscillate at different frequencies depending on the environmental conditions such as temperature and voltage, and will indicate the relative performance of which the silicon die is capable.

Gated Counter

Figure 4:
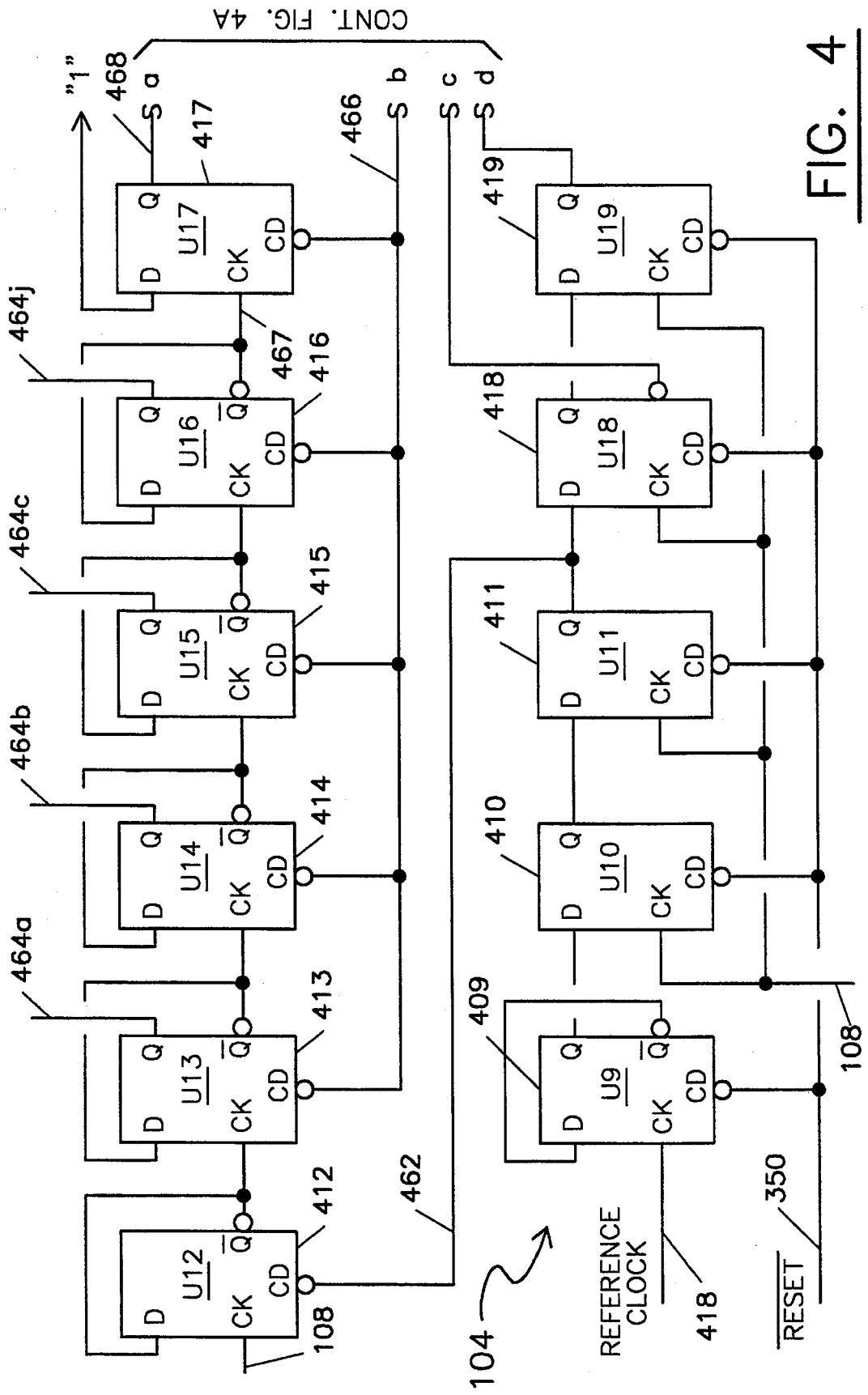
FIGS. 4 and 4A are schematic diagrams of a preferred embodiment of a gated counter and decision circuit of the present invention.
Figure 4A:
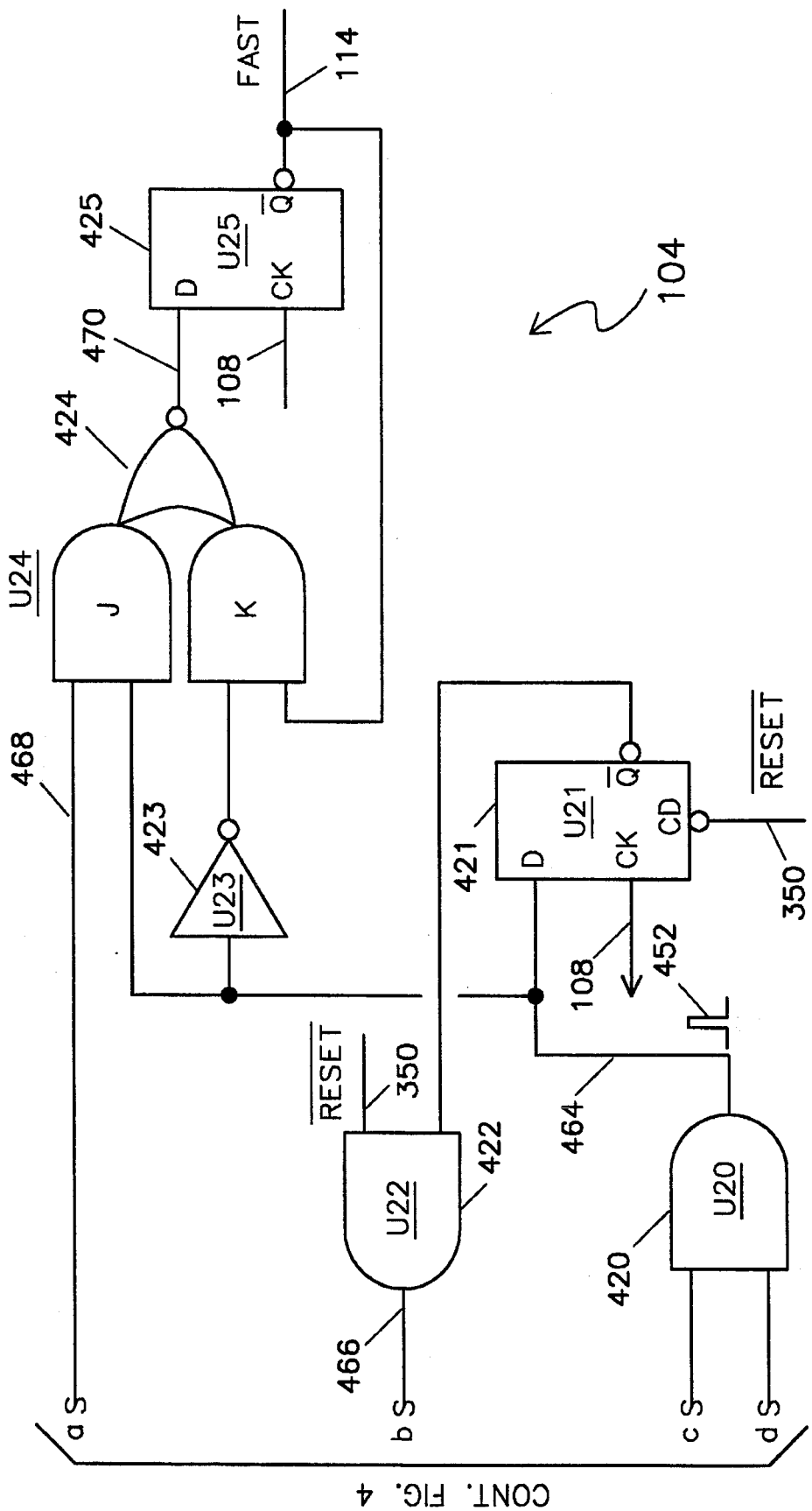

The gated counter 104 is utilized for quantizing the ratio of the relaxation frequency (output 108) and the reference clock output 218. Referring now to FIGS. 4 and 4A, a schematic diagram of a preferred embodiment of a digital logic circuit for the gated counter 104 is illustrated. The gated counter 104 consists of D flip-flops 409 through 419, 421 and 425; AND gates 420 and 422; inverting buffer 423; and AND/OR/INVERT gate 424.

The gated counter 104 quantizes the ratio of the relaxation oscillator frequency output 108 and the reference clock output 218 by periodically counting the frequency output 108 in flip-flops 412 through 416 which are connected as a ripple counter that counts over a controlled period of time. The controlled period of time may be one period of the reference clock output 218. Normally, the relaxation frequency will be 20 to 32 times the reference clock frequency, however, if the ratio is small, i.e., the relaxation frequency is only two or three times the reference clock frequency, more granularity and resolution may be obtained by having the controlled time period extend over multiple periods of the system clock frequency.

For example, the reference clock output 218 is a constant 10 MHz, having a period of 100 nanoseconds, and the relaxation frequency (output 108) varies in frequency from about 200 to 320 MHz as a result of circuit layout, voltage and temperature conditions, etc. Consequently, the ratio between the relaxation and reference frequencies will be from 20 to 32. Thus, five ripple counters comprised of D flip-flops 412 through 416 record the ripple count to a maximum of 32 during the count enable period of the reference clock output 218.

Initially, D flip-flop 412 is held reset by a logic 0 on the output of D flip-flop 411. Flip-flops 409, 410, 411, 418 and 419 are reset when the reset signal 350 is at logic 0 and enabled when reset signal 350 is at logic 1. Flip-flop 409 changes its output state on every reference clock output 218 pulse, i.e., the Q output is at logic 1 for one reference clock 216 period and at logic 0 for the next clock period 216. When the Q output of flip-flop 409 is at logic 1, flip-flop 410 shifts a logic 1 to its output upon a pulse from clock 108. A logic 1 is similarly shifted to the output of flip-flop 411 on the next clock 108 pulse. The flip-flops 410 and 411 are utilized to synchronize the Q output of flip-flop 409 to the higher speed relaxation oscillator frequency output 108. In addition, the flip-flops 410 and 411 eliminate the potential for metastability by delaying the reset/enable signal 462 by two clock 108 pulses.

The clock input of flip-flop 412 is connected to the relaxation oscillator frequency output 108 and causes the Q and Q-bar outputs to toggle at every output 108 pulse. The flip-flop 412, however, will not toggle whenever its reset is at a logic 0. Thus, flip-flop 412 is controlled by the Q output of flip-flop 411, and only is allowed to toggle during alternate reference clock output 218 periods when the Q output of flip-flop 411 is at logic 1 (signal 462).

When the flip-flop 411 output signal 462 is at a logic 1, the flip-flop 412 Q output toggles each time there is a clock 108 pulse. Whenever the output of flip-flop 412 goes from a logic 0 to a logic 1, flip-flop 413 output toggles. In similar fashion the outputs of flip-flops 414, 415 and 416 toggle whenever the respective clock inputs go from a logic 0 to a logic 1.

Every time the Q-bar output of flip-flop 412 goes to a logic 1, the Q-bar output of flip-flop 413 toggles logic state. When the Q-bar output of flip-flop 413 goes to a logic 1, then flip-flop 414 toggles its Q-bar output logic state. In similar fashion, the outputs of the flip-flops 415 and 416 toggle or "count" In this manner, flip-flops 412 through 416 ripple count the number of output 108 pulses during a period of the reference clock output 218. The four most significant bits of the quantized number of output 108 pulses may be read from the Q outputs 464a through 464d.

The binary value on the Q outputs 464 may be parallel loaded into a storage register (not illustrated) just before flip-flops 413 through 416 are reset by signal 466 from the AND gate 422. Flip-flop 417 is used to capture a count greater than 32. The Q output of flip-flop 417 becomes a logic 1 when signal 467 goes from a logic 0 to a logic 1. Thus, a count in the ripple counters flip-flops 412 through 416 greater than 32 will be retained in the flip-flop 417. The quantized ratio count is maximum just before a logic 0 reset signal 466 from AND gate 422 is received by the flip-flops 413 through 417. The counter Q outputs 464a through 464d may be sent on the output bus 212 (FIG. 2) to the frequency controller 206 and utilized as mentioned above.

Flip-flop 421 is used to control a reset that allows enough time to record the ripple count value without having a race condition. There is some delay between the Q-bar output of flip-flop 418 and the Q output of flip-flop 419. The AND gate 420 detects this delay and produces a pulse 452 on its output. AND gate 420 only produces a logic 1 on its output when both of its inputs are also at logic 1.

There is a pulse 452 only when the Q output of flip-flop 419 is at a logic 1 and the Q-bar output of flip-flop 418 is at a logic 1. Thus, pulse 452 occurs every other reference clock output 218 period and signifies the end of a reference clock 218 period. The pulse 452 is applied to the D input of the flip-flop 421 where it is resynchronized with frequency output 108, and which clocks it into and inverts it in the Q-bar output of the flip-flop 421. The Q-bar output of flip-flop 421 is connected to one input of the AND gate 422. Whenever either input of the AND gate 422 is at a logic 0, its output is at a logic 0. The output of the AND gate 422, when at logic 0, is utilized to reset flip-flops 413 through 417. The Q-bar output of flip-flop 421 has a pulse width of one period of the signal clock 108.

Speed Adjustment Control Circuit

In another aspect of the present invention, the speed adjustment control circuit 106 (FIG. 1) may consist of AND/OR/INVERT gate 424 and flip-flop 425 which together form a J–K flip-flop. An input of gate 424 is connected to the Q output of flip-flop 417. When the Q output of flip-flop 417 is at a logic 1, there is a high count signal 468 representing a relaxation oscillator output 108 of higher frequency. This high count is the high ratio signal 112 of FIG. 1 and is indicative of a silicon die having fast propagation.

The Q-bar output of flip-flop 425 is set to a logic 1 by applying a logic 0 from the output of the gate 424. The flip-flop 425 loads the logic value of signal 468 when signal 452 is a logic 1 and clock 108 goes to logic 1. In this way, the signal 114 retains whether the relaxation oscillator 102 is running fast or slow depending on what ratio is determined by the ripple counter (flip-flops 412–416).

The fast/slow output 114 may be utilized to indicate whether the semiconductor die is running fast or slow by indicating either a logic 1 or 0, respectively. The fast/slow output 114 may also be utilized to control changing the speed of the system clock (not illustrated) to the most advantageous speed for operating the semiconductor die under its presently indicated condition or to adjust delay timing to meet interface setup and settling requirements.

The number of ripple counter flip-flops may be selected to cover the anticipated relaxation oscillator frequency range of ratio quantization values. This range of ratio quantization values may be determined by computer design simulation based on the timing models of the primitives used for the relaxation oscillator 102.

One skilled in the art of digital circuit design and microprocessors will readily appreciate that running a microprocessor as fast as possible results in the most powerful software performance of a computer system. Having to constrain the speed of the microprocessor to artificially lower speeds so as to insure reliable performance at worst-case conditions is both wasteful and unnecessary when utilizing the present invention.

The present invention enables implementing a self-compensating system clock that can effectively maintain constant efficiency of the digital logic being evaluated by the quantized ratio of the relaxation frequency to system clock frequency. Maintaining a fixed ratio keeps the system efficiency constant throughout all operating conditions and parameters.

A simple decision circuit may also be easily implemented on a semiconductor die for determining whether fast or slow operation is appropriate. Fast operation may be used when the semiconductor die can reliably operate in a fast mode, and slow operation may be used when reliable operation in the fast mode is not possible.

Figure 5:
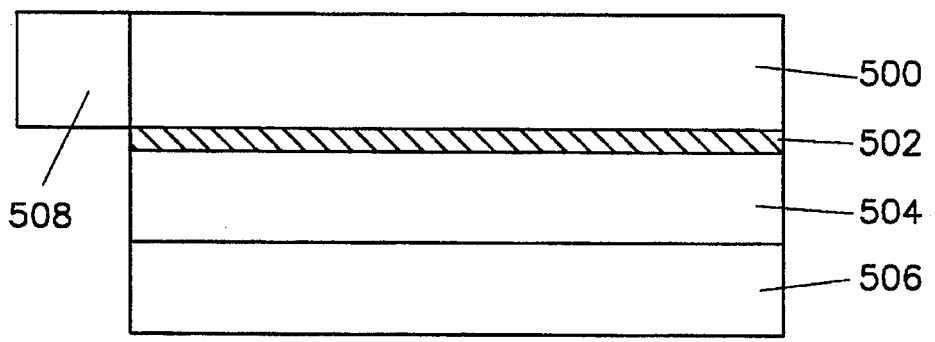
FIG. 5 is a schematic elevational view of an aspect of the present invention utilizing a thermoelectric heat pump.

When maintaining optimal speed and performance is critical, the temperature of the semiconductor die may be kept at an optimal temperature by means of a heat pump. Referring now to FIG. 5, a schematic elevational view of a heat pump system of the present invention is illustrated. A semiconductor die is in close thermal communication with a thermoelectric heat pump 504. The die 500 may be attached to the heat pump 504 with thermally conductive epoxy 502 or other means well known to those in the art of semiconductor packaging. A heat sink 506 is attached to, and takes heat from or supplies heat to, the heat pump 504 as necessary.

The heat pump 504 may be, for example, a thermoelectric (Peltier) heat pump manufactured by Material Electronic Products Corporation ("Melcor"). The Melcor "FRIGI-CHIP"™ heat pump 504 is a solid state thermoelectric heat pump that utilizes the Peltier effect to perform both cooling and heating functions. A more detailed description of a suitable heat pump device is available in Melcor literature, and the Melcor literature is incorporated by reference herein for all purposes. Heat sinks are well known to those skilled in the electronic arts.

Figure 6:
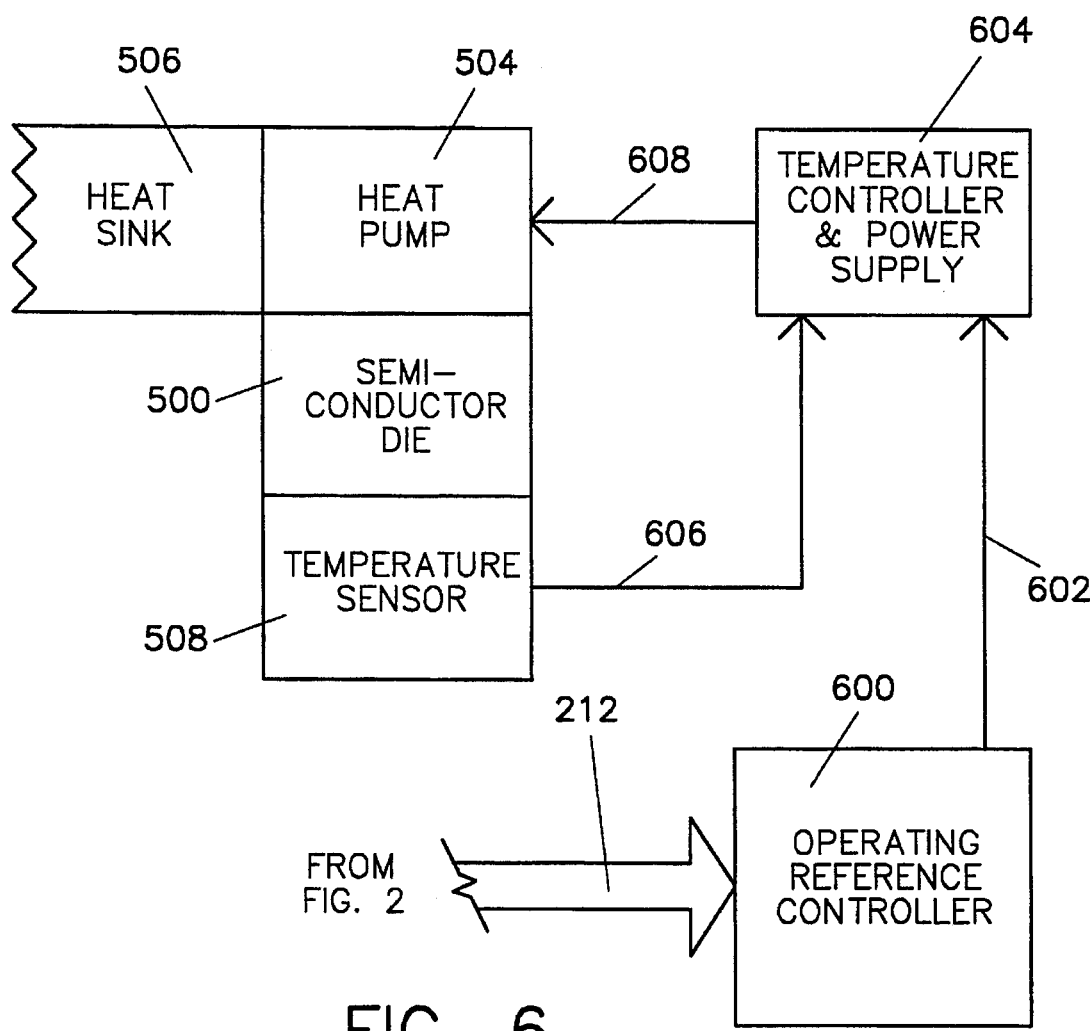
FIG. 6 is a schematic block diagram of a control system for the heat pump embodiment of FIG. 5.

Referring now to FIG. 6, a schematic block diagram of a control system for maintaining the temperature of the semiconductor die is illustrated. The heat pump 504 is powered and controlled by a power supply and temperature controller 604. The temperature controller 604 receives the die 500 temperature information 606 from the temperature sensor 508. A set point signal 602 from an operating reference controller 600 determines the preferred temperature at which the die 500 operates.

The controller 600 obtains the quantized ratio indicating the operating performance of the die 500 from the output bus 212 (FIG. 2). From this information, the controller 600 determines the optimal operating temperature of the die 500 and transmits same to temperature controller 604 by means of the set point signal 602. In this way, the temperature of the die 500 is maintained at a substantially optimum operating point.

Digital System

The present invention may be utilized to maintain proper setup and hold times on a receiving interface, proper timing of output data, correct timing of direct pass through of data, and for taking full advantage of the computational power of the integrated circuits utilized in a digital system. A digital system may comprise single chip modules (SCM) including other electrical components; multi-chip modules (MCM) having a plurality of integrated circuits, with or without other electrical components; board level products (BLP) such as those having multiple integrated circuits on printed wiring board(s) (PWB); and box level products (BLP) integrated into a functional system or subsystem. The system level products contemplated include digital data storage; security and surveillance systems, general purpose computers (such as personal computers, work stations, servers, mini computers, mainframe computers and super computers); digital audio and video compression and transmission; transportation vehicles such as airplanes, trains, automobiles, helicopters, rockets, missiles, boats, submarines, and the like; subsystems utilized in such vehicles (such as GPS navigation, navigational displays and controllers, hazard avoidance such as radar and sonar, fly by wire control, and digital engine control and monitoring); entertainment systems (such as television and radio, digital cameras, audio and video recorders, compact disc players, digital tape, and the like); and communications (such as telephones including portable and cellular, PBX, telephone switching systems, voice mail, auto attendant, network controllers, video teleconferencing, digital data transmission such as token ring, ethernet, ATM, or and like).

Dynamically evaluating the performance of the integrated circuits comprising the digital system allows the design engineer to implement a design based upon "best-case" device parameters not "worst-case" device parameters, as was heretofore required to insure reliability over all operating conditions. This is especially significant in digital data compression and communications systems, and the like.

The present invention may be effectively utilized in a complex digital system. A plurality of semiconductor integrated circuits, each having a relaxation oscillator 102 disposed thereon, have the frequencies of the respective relaxation oscillators 102 measured by frequency measurement circuits such as disclosed above, or by any other type of frequency measuring means such as a frequency counter or the like. A monitoring and control circuit may evaluate each of these relaxation frequencies and determine an optimal system clock speed at which all of the integrated circuits may reliably operate. Typically, the integrated circuit having the lowest relaxation oscillator frequency is the slowest and must be operated at a slower system clock (lower frequency). Not all integrated circuits of the system need be monitored for operating speed when those integrated circuits are inherently faster than the other integrated circuits, or the integrated circuit performs certain functions such as a clock oscillator.

The present invention may also be utilized to characterize the range of reliable operation of an integrated circuit by correlating the relaxation oscillator frequency of the integrated circuit over a plurality of both temperature and voltage values at which the integrated circuit may operate. Characterization of the integrated circuit allows an objective determination from the relaxation frequency measured of how fast the integrated circuit may operate at a give temperature and voltage value. This is invaluable in dynamically determining and setting a reliable maximum operating speed for each integrated circuit in the digital system. Matching of compatible integrated circuits that must operate together is also easily facilitated by the present invention.

When a system requires a certain operating speed, the voltage and/or temperature parameters of the integrated circuits may be adjusted so as to realize a minimum appropriate relaxation oscillator frequency for each integrated circuit. Conversely, when the integrated circuits of the system are much faster than necessary for desired operation, the voltage to these integrated circuits may be lowered to reduce power consumption of the system.

Temperature and voltage may be controlled over the entire system, sections of the system, or for each individual integrated circuit. Temperature control may be obtained as disclosed above or by any means known to those skilled in the art of environmental control. Voltage control may be obtained with programmable voltage regulators connected at the system, subsystem, or integrated circuit levels.

Figure 7:
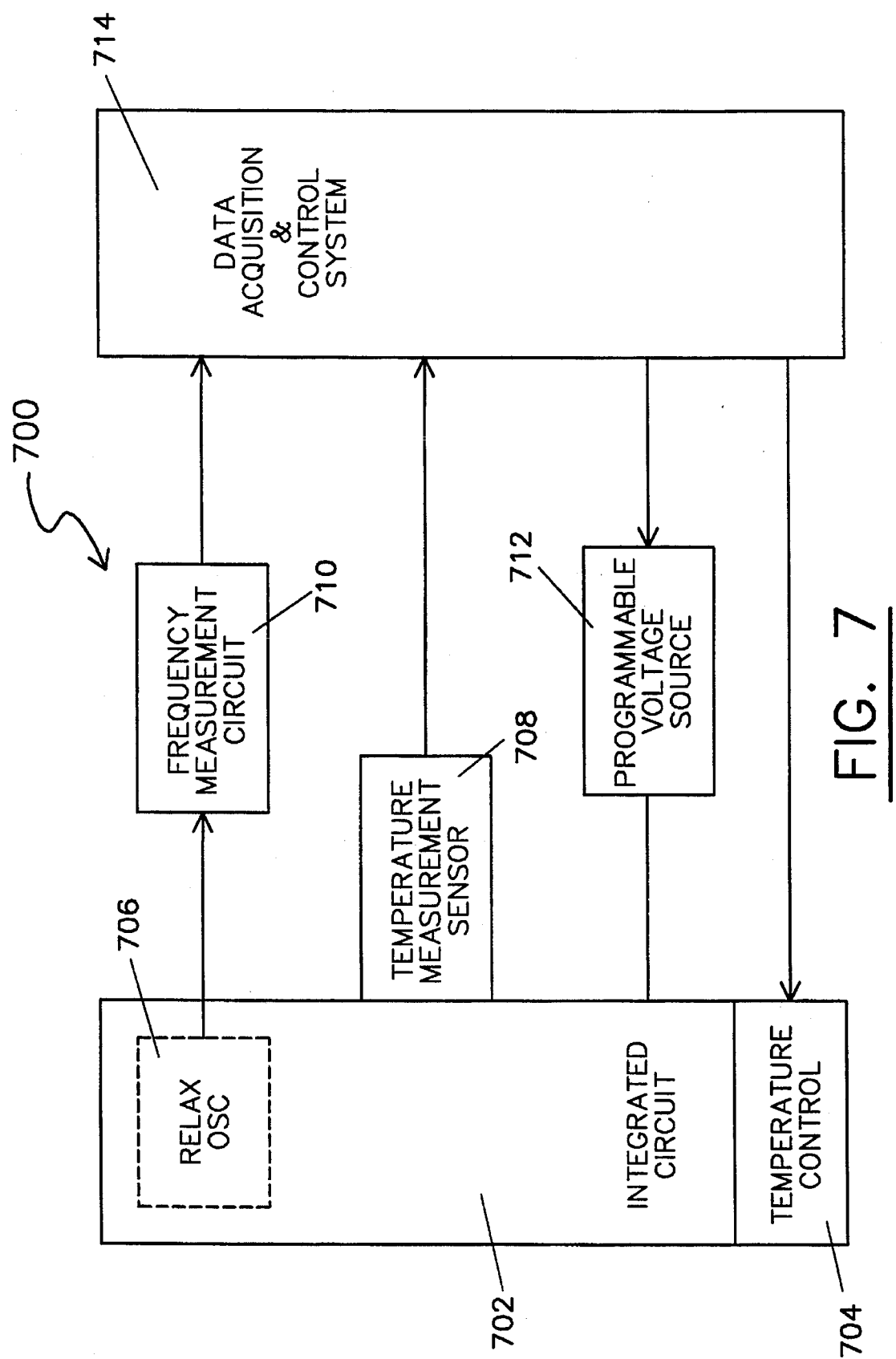
FIG. 7 is a schematic block diagram of an integrated circuit evaluation and grading system according to the present invention.

Referring now to FIG. 7, a schematic block diagram of an integrated circuit evaluation system according to the present invention is illustrated. An integrated circuit evaluation system, generally represented by the numeral 700, comprises a test fixture (not illustrated) that connects to an integrated circuit 702 to be tested. The integrated circuit 702 has a relaxation oscillator 706 disposed thereon. The frequency of the relaxation oscillator 706 is measured by a frequency measurement circuit 710. The frequency measurement circuit 710 sends the measured relation oscillator 706 frequency to a data acquisition and control system 714 which records and correlates the frequency with related temperature and voltage measurements.

A temperature measurement sensor 708 measures the temperature of the integrated circuit 702, and sends this temperature measurement information to the data acquisition and control system 714 for storage and correlation with related frequency and voltage measurements. A temperature control source 704, optionally, may control the temperature of the integrated circuit 702 over a temperature range of interest. The temperature control source 704 may be, for example, the above mentioned heat pump 504 and heat sink 506 (FIG. 5) or an environmental chamber (not illustrated) containing the integrated circuit 702. The temperature control source 704 is controlled by the data acquisition and control system 714 to vary the temperature of the integrated circuit 702 while under test and evaluation. The temperature control source 704 may also be utilized in an operational system to bring the integrated circuit 702 to a desired temperature, for example, when the operating speed of the integrated circuit 702 needs to be increased by lowering its temperature.

A programmable voltage source 712 is controlled by the data acquisition and control system 714, and is used to vary the operating voltage applied to the integrated circuit 702. The data acquisition and control system 714, thus, may control a plurality of voltages and temperatures at which the integrated circuit may operate during testing thereof. A measurement of each frequency of the relaxation oscillator 706 for each combination of the integrated circuit 702 operating voltage and temperature may be determined and stored in the data acquisition and control system 714. Operating speed curves for the integrated circuit 702 may be calculated and plotted for each integrated circuit 702 tested. This information may be used in a look up table of a digital control system for optimal operation of the characterized integrated circuit. In addition, from the correlated operating characteristics of a plurality of integrated circuits, the integrated circuits may be matched up so that all of the integrated circuits selected for a system may operate with comparable capabilities. The embodiment of FIG. 7 enables objective characterization (grading) of the reliable operating speeds of an integrated circuit over all possible combinations of temperature and voltage.

Figure 8:
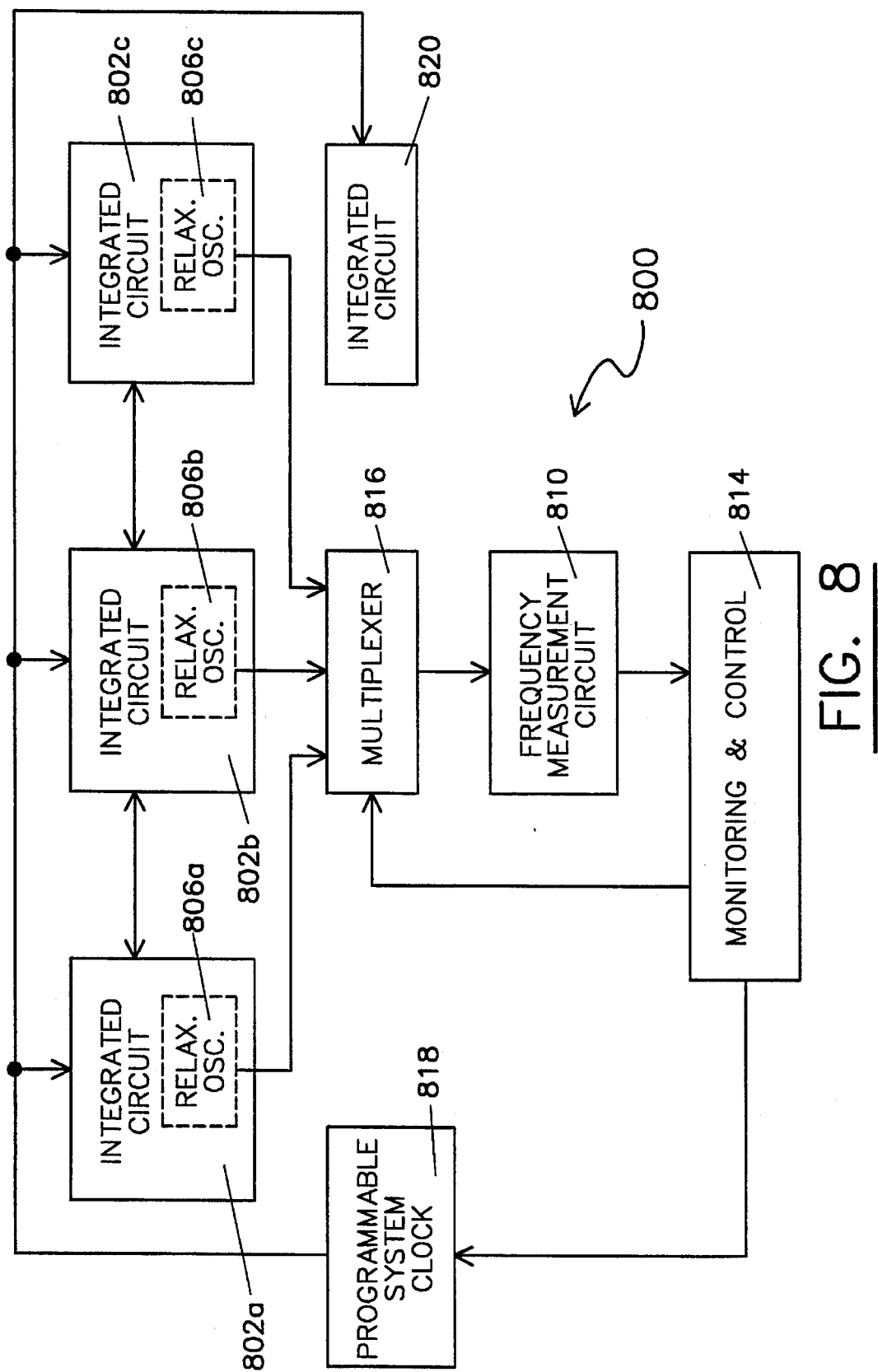
FIG. 8 is a schematic block diagram of a digital system according to the present invention.

Referring now to FIG. 8, a schematic block diagram of a digital system according to the present invention is illustrated. The digital system 800 is comprised of a plurality of integrated circuits 802, a programmable system clock 818, a multiplexer 816, a frequency measurement circuit 810, and monitoring and control 814. The integrated circuits 802a–802c are interconnected, typically, to perform functions such as, for example, computation, digital video compression, digital signal processing, forward error correction, navigation and guidance, or other complex digital monitoring, control or computational systems.

Integrated circuits 802a–802c have relaxation oscillators 806a–806c, respectively, disposed thereon. The relaxation oscillators 806 run at the natural frequencies of the respective integrated circuits 802. The natural frequency will vary for different values of temperature and voltage being applied to the integrated circuit 802. Integrated circuit 820 does not have a relaxation oscillator, since not all of the integrated circuits may be critical to the operation of the system nor have a minimum operating speed that may pose a problem.

The frequencies of the relaxation oscillators 806a–806c are measured by the frequency measurement circuit 810. The multiplexer 816 connects each relaxation oscillator 806a–806c to the frequency measurement circuit 810, and the frequency measurement circuit 810 sends each relaxation oscillator frequency value to the monitoring and control 814. From these relaxation oscillator frequency values, the monitoring and control 814 determines the maximum usable frequency for the programmable system clock 818. A plurality of measurement circuits 810 may be utilized instead of the multiplexer 816. The circuits (FIGS. 1–4A) for determining the ratio value may be implemented on each integrated circuit, and this ratio value sent directly to the monitoring and control 814.

The monitoring and control 814 may be, for example, a programmable logic array (PLA), application specific integrated circuit (ASIC), microprocessor and program, or the like. The monitoring and control 814 may utilize a look-up table derived from data obtained during characterization (grading) of each integrated circuit 802 as disclosed above. The programmable system clock 818 is controlled by the monitoring and control 814 so that a desired system clock frequency is produced.

The present invention adjusts the frequency of the system clock 818 to correlate with the entire range of temperature and voltage values that the digital system 800 is likely to encounter. The adjustment to the system clock 818 frequency may be based upon the slowest integrated circuit 802, as determined by its respective relaxation oscillator 806 frequency. Phase-locked-loop oscillators may also be utilized to synchronize in phase a plurality of programmable clock oscillators. However, care must be exercised in the use of the phase-locked-loop oscillators, since they typically have a limited range of operating frequencies. In order for a typical phase-locked-loop to operate over the frequency range of the present invention, different time constants may be utilized in the frequency determining circuits of the phase-locked-loop, as is well known to those skilled in the art. Preferably, digital phase-locked-loops may be utilized for the phase-locked-loops.

It is contemplated in the present invention that the monitoring and control 814 may also measure and control the digital system 800 temperature and voltage (see FIG. 7). Temperature and voltage control may be accomplished at system, subsystem, or component levels as disclosed above. The entire digital system may draw less power if its operating voltage is reduced, or at least one integrated circuit may have its reliable operating speed increased by changing its operating temperature.

Figure 9:
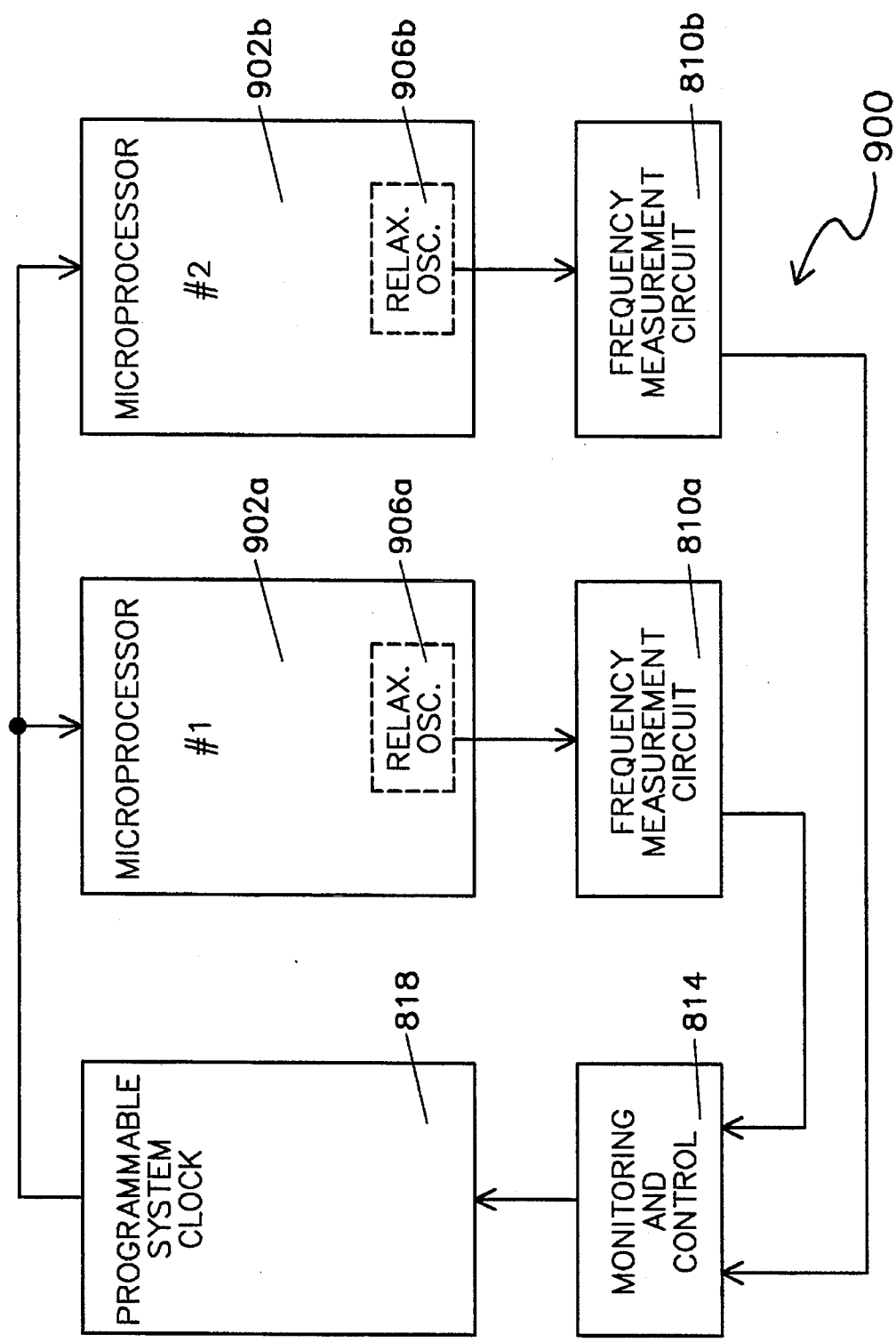
FIG. 9 is a schematic block diagram of a multiprocessor computer system.

Referring now to FIG. 9, a schematic block diagram of a multiprocessor computer system according to the present invention is illustrated. The digital system 900 is comprised of microprocessors 902a and 902b, programmable system clock 818, frequency measurement circuits 810a and 810b, and monitoring and control 814. Microprocessors 902a and 902b are interconnected, typically, to perform high speed parallel computation.

Microprocessors 902a and 902b have relaxation oscillators 906a and 906b, respectively, disposed thereon. The relaxation oscillators 906a and 906b run at the natural frequencies of the respective microprocessors 902a and 902b. The natural frequency of each microprocessor will vary for difference values of temperature and voltage being applied thereto. Programmable system clock 818 does not have a relaxation oscillator, since not all of the integrated circuits may be critical to the operation of the system nor have a minimum operating speed that may pose a problem.

The frequencies of the relaxation oscillators 906a and 906b are measured by the frequency measurement circuits 810a and 810b, respectively, and sends each relaxation oscillator frequency value to the monitoring and control 814. From these relaxation oscillator frequency values, the monitoring and control 814 determines the maximum usable frequency for the programmable system clock 818. The present system may also program the clock 818 to run faster when the slower one of the microprocessors 902 is not being utilized. The clock 818 speed may be thus be adjusted to dynamically optimize the operation of the system for all temperature, voltage and operational requirements.

Figure 10:
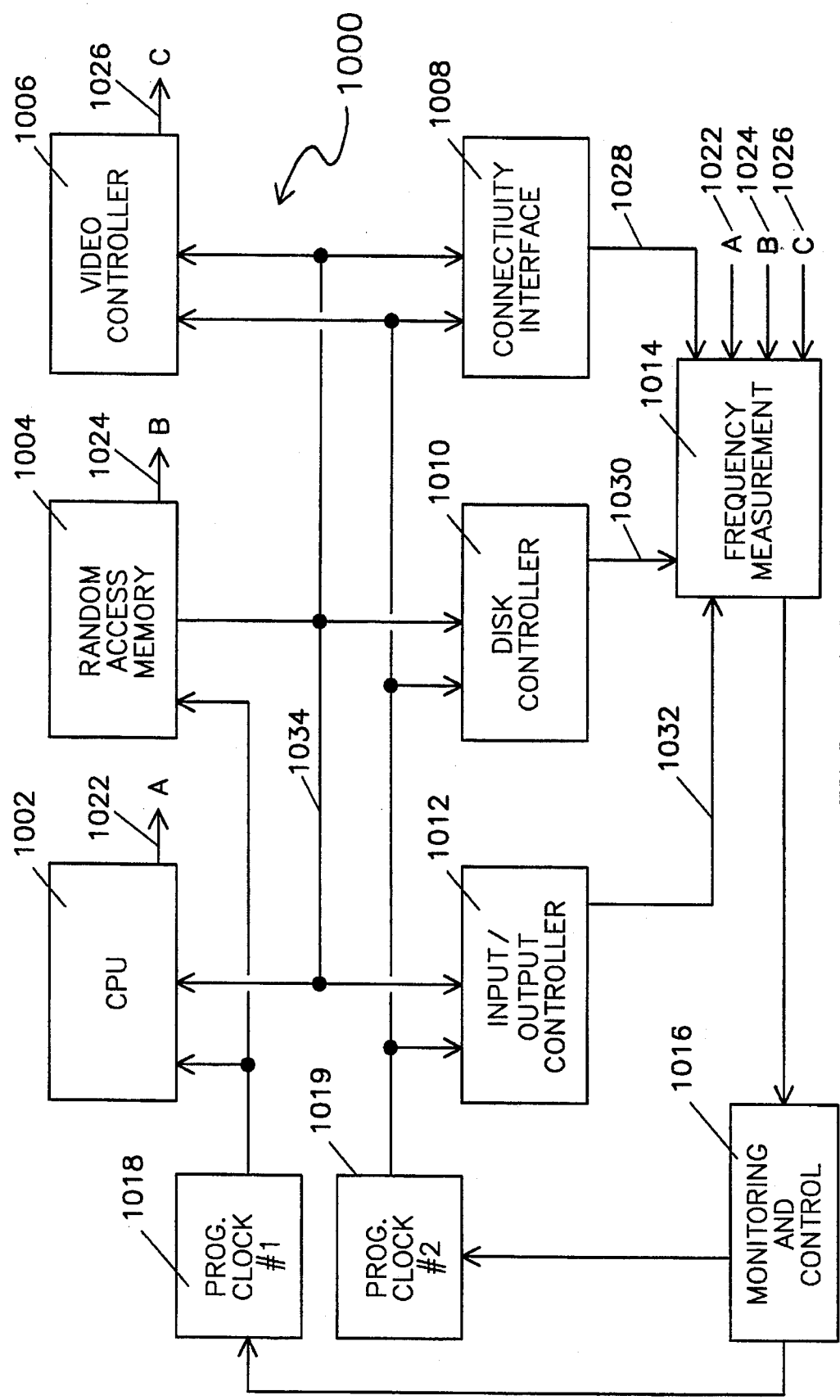
FIG. 10 is a schematic block diagram of a complex digital computer system utilizing the present invention.

Referring to FIG. 10, a schematic block diagram of a complex digital computer system is illustrated. The digital computer system 1000 comprises a central processing unit ("CPU") 1002 which operates in conjunction with the following subsystems: random access memory ("RAM") 1004, video controller 1006, connectivity interface 1008, disk controller 1010, and input/output controller 1012. The aforementioned subsystems are interconnected with each other and the CPU 1002 by bus system 1034.

The system 1000 utilizes two programmable clocks 1018 and 1019. Clock 1018 is utilized with the CPU 1002 and RAM 1004. Clock 1019 is utilized with the video controller 1006, connectivity interface 1008, disk controller 1010, and input/output controller 1012. Clock 1018 may run at a faster or slower speed than clock 1019. The present invention contemplates multiple system clocks running at different speeds with or without phase lock synchronization therebetween.

The speed of the clocks 1018 and 1019 are controlled by monitoring and control 1016 in accordance with the information supplied by frequency measurement 1014. Frequency measurement 1014 determines the relaxation oscillator frequencies of the CPU 1002, RAM 1004, video controller 1006, connectivity interface 1008, disk controller 1010, and input/output controller 1012 by frequency outputs 1022, 1024, 1026, 1028, 1030, and 1032, respectively. The clocks 1018 and 1019 are programmed accordingly to run the system 1000 at a maximum reliable operating speed consistent with the slowest subsystem required to operate at a given time.

Figure 11:
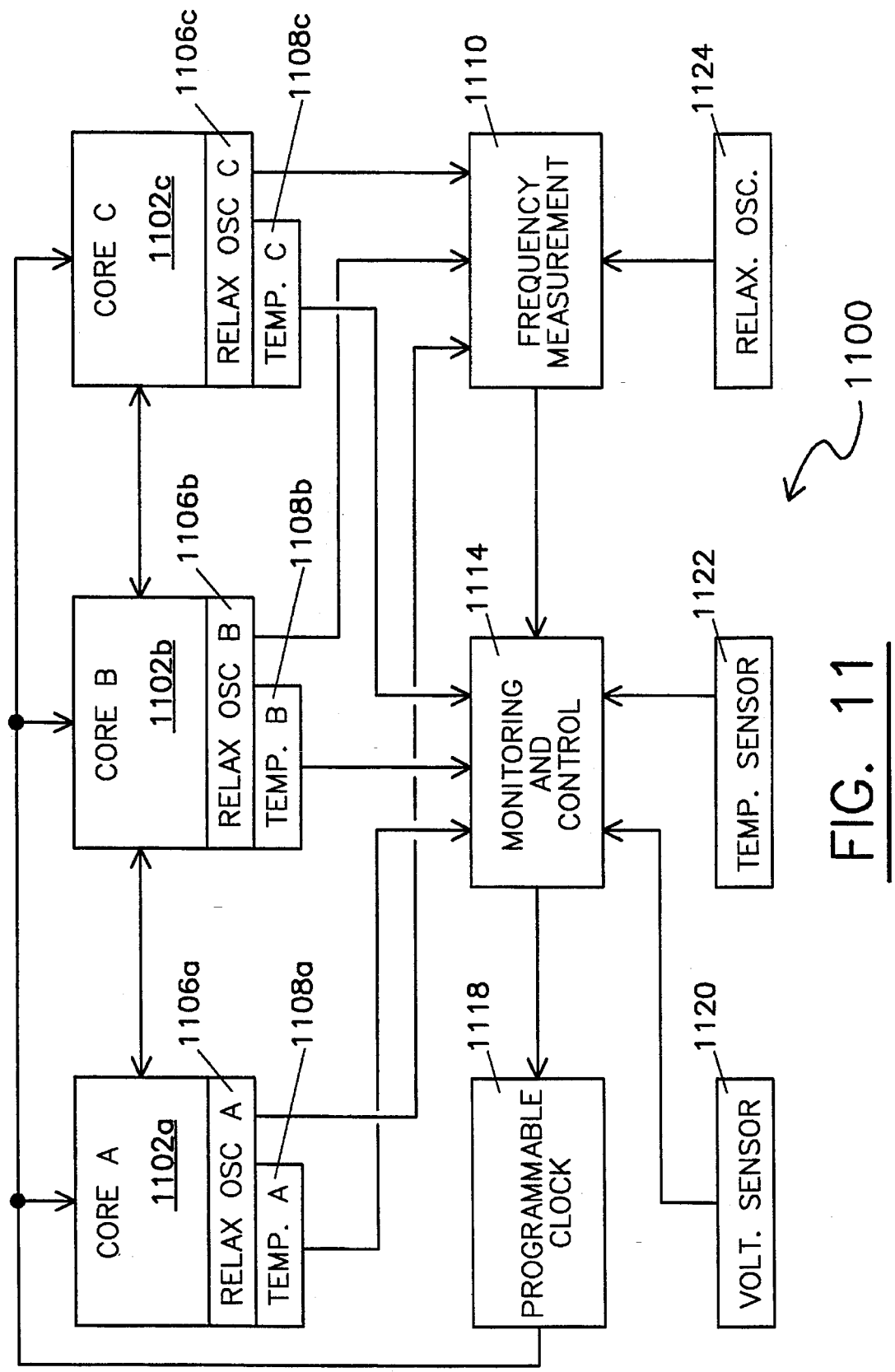
FIG. 11 is a schematic block diagram of a large scale integrated circuit utilizing the present invention.

Referring now to FIG. 11, a schematic block diagram of a large scale integrated circuit according to the present invention is illustrated. The large scale integrated circuit 1100 is comprised of at least one functional logic core 1102, a programmable system clock 1118, a frequency measurement circuit 1110, and monitoring and control 1114. The integrated circuit 1100 may also have a relaxation oscillator 1124, a temperature sensor 1122, and a voltage sensor 1120 disposed on the die. Typical applications for the large scale integrated circuit 1100 may be single package computer and control systems, digital signal processing engines, data compression engines, forward error correction engines, and the like.

The voltage sensor 1120 measures the power supply voltage applied to the integrated circuit 1100. The temperature sensor 1122 measures the temperature of the integrated circuit die. The relaxation oscillator 1124 indicates the maximum useable operating speed of the integrated circuit 1100 at the instant operating temperature and voltage. The relaxation oscillator 1124, and voltage and temperature sensors 1120 and 1122, respectively, indicate the operating parameters of the integrated circuit 1100 as a whole. Finer granularity in determining optimum operating speed of individual functional logic cores 1102 may utilize individual relaxation oscillators 1106 and temperature sensors 1108 disposed at each respective core 1102.

Each functional logic core 1102a–1102c may have a relaxation oscillator 1106a–1106c, and/or a temperature sensor 1108a–1108c, respectively. The relaxation oscillator frequencies are measured with the frequency measurement circuit 1110 and the measured frequency values, as well as temperature values from the temperature sensors are input to the monitoring and control 1114. The monitoring and control 1114 may utilize a built-in table-look or other algorithm to determine the appropriate maximum clock speed at which each core 1102 may reliably operate. Each core may have very different maximum operating speeds for a given relaxation oscillator frequency because of the function and complexity (i.e., number of gate levels) variations between cores. Thus, a characterization factor for each core may be needed even though the silicon of each core may run at the same speed.

Each core silicon speed also may be different depending on operating temperature differences and process variations during fabrication thereof. Therefore, a feature of the monitoring and control 1114 is to factor in the characterization parameters of each individual core 1102 so that all of the cores 1102 may operate at the maximum reliable operating speed determined by the slowest functional constraint.

Figure 12:
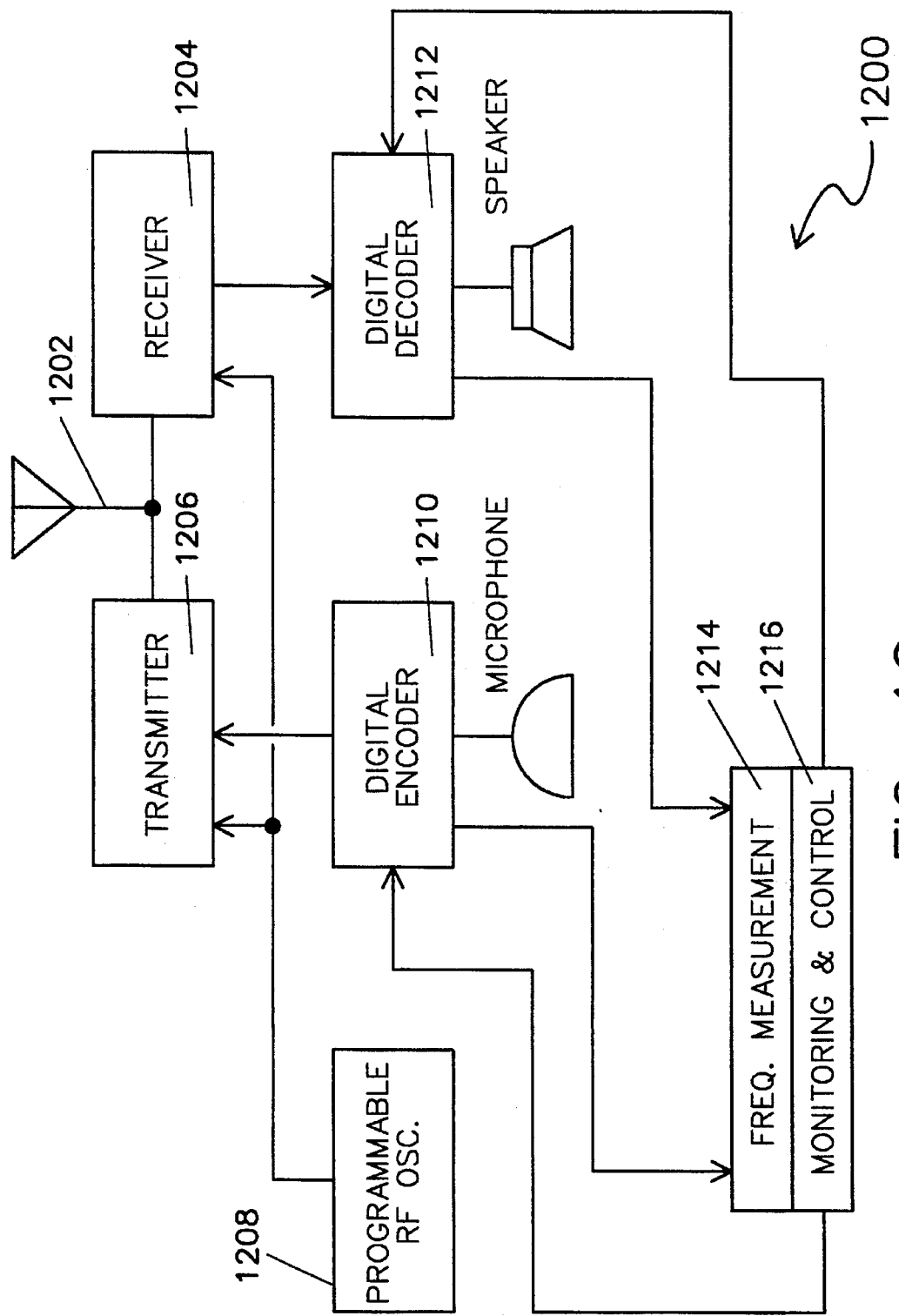
FIG. 12 is a schematic block diagram of a digital cellular telephone utilizing the present invention.

Referring to FIG. 12, a schematic block diagram of a digital cellular telephone system is illustrated. The digital cellular telephone system 1200 comprises a transmitter 1206, receiver 1204, antenna 1202, programmable radio frequency oscillator 1208, digital encoder 1210, digital decoder 1212, frequency measurement 1214, and monitoring and control 1216. The digital encoder 1210 and decoder 1212 may have mostly common circuits, but are illustrated separately for clarity. Included on at least one of the encoder 1210 and decoder 1212 integrated circuits comprising the digital logic is at least one relaxation oscillator (not illustrated) disposed on the at least one integrated circuit as more fully described above.

Digital communications, both video and audio, requires manipulation of analog signals into digital signals representative of the respective analog signals. The digital signal information is compressed in order to reduce the information bandwidth requirements of the digital telephone system 1200, as is well known to those skilled in digital communications. The present invention allows optimal performance of the digital information processing logic in a digital communication system such as a cellular telephone, direct broadcast satellite television and the like.

Figure 13:
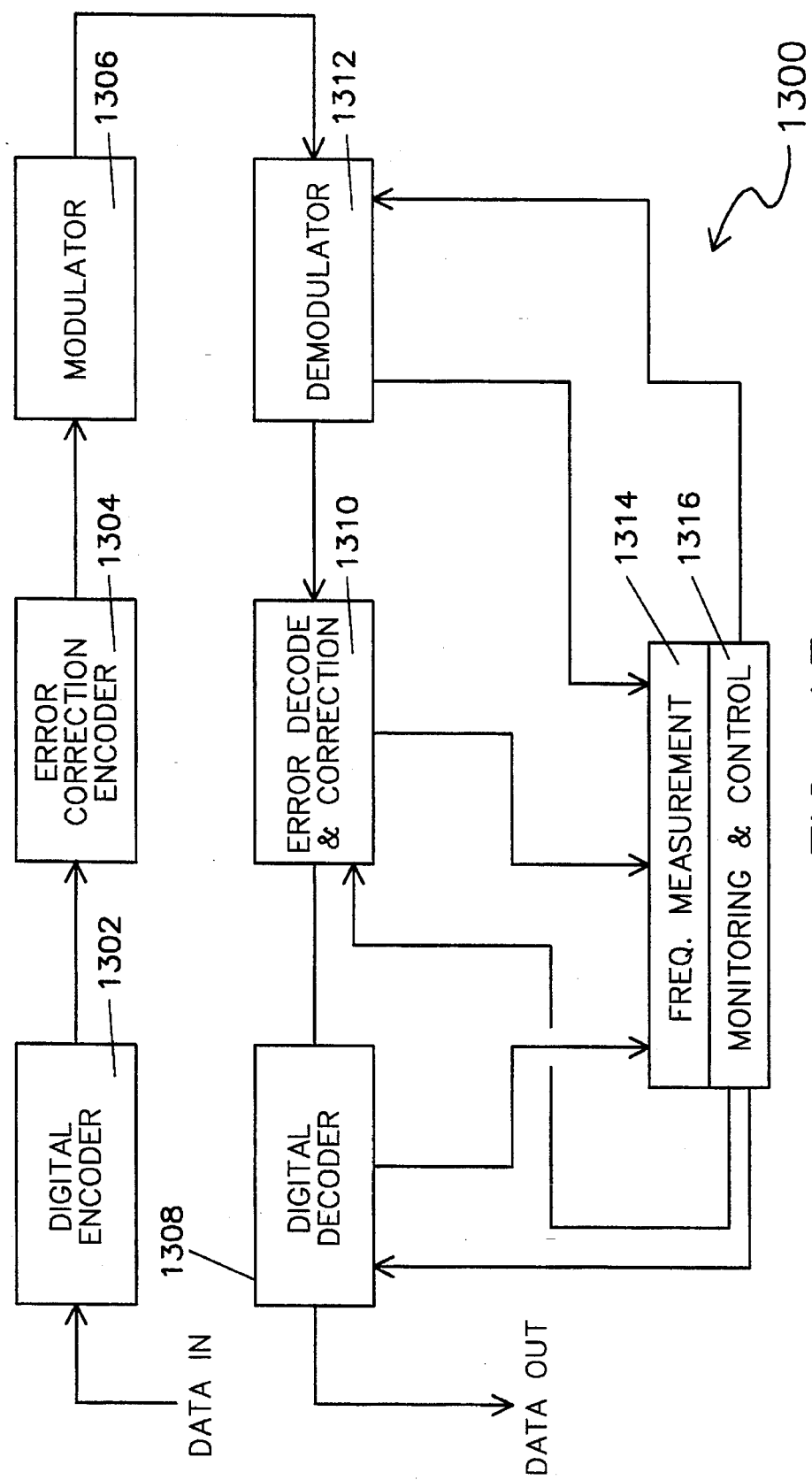
FIG. 13 is a schematic block diagram of a digital home entertainment system utilizing the present invention.

Referring to FIG. 13, a schematic block diagram of a digital entertainment system such as digital television, CD video and audio, and direct broadcast satellite is illustrated. The digital entertainment system 1300 is becoming more prevalent and is creating new entertainment for both the consumer and provider. Use of real time high resolution video and multiple channel stereo audio requires that the digital circuits have very high data throughput. The greater the resolution of the information being displayed the faster the digital circuits must operate. Very fast digital circuits have a cost premium, thus restricting the demand of such systems with the consumer. The present invention allows less expensive digital circuits to perform the necessary digital logic functions required of the new digital entertainment systems without having to pay a premium. In addition, these digital circuits may reliably operate over a wider temperature and voltage range then was heretofore possible.

The entertainment system 1300 may comprise a digital encoder 1302, error correction encoder 1304, and modulator 1306 at the transmission end of the system 1300. The reception end of the system 1300 may comprise a demodulator 1312, error decode and correction 1310, digital decoder 1308, frequency measurement 1314, and monitoring and control 1316. The transmission end logic may also include a frequency measurement, and monitoring and control 1316 (not illustrated) for running the digital circuits at their fastest reliable speeds as discussed more fully above.

Digital flat screen display systems such as, for example, liquid crystal displays, plasma displays, laser driven out of plane and laser driven in plane displays, and any projected pixel display whether by normal light or by laser may utilize the present invention to accomplish the ends and obtain the results as described above.

The present invention may be utilized to characterize operating parameters of digital integrated circuits and to derive simulated technical libraries which allow layout parameters for the integrated circuits to be back-annotated into a data base. This information may be subsequently used for performance predictions of the integrated circuits in an operating system. From this information, the expected performance of the critical sections of the functional circuits of the integrated circuit may be determined over the entire operating temperature and voltage ranges.

The present invention is thus applicable to any digital technology requiring interaction between different integrated circuits in a digital system, or different functional core blocks of a large scale integrated circuit. Examples of digital systems that may benefit from the system and method of the present invention have been mentioned above. The spirit and intent of the present invention is to improve the operating speed capacity and reliability of all digital systems from a single semiconductor integrated circuit die to a complex multiple box computing system.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A method for determining the reliable operating speed of a semiconductor integrated circuit die when operated at a desired voltage and temperature, said method comprising the steps of:

maintaining a desired temperature on an integrated circuit die;

applying a desired operating voltage to the integrated circuit die;

generating a frequency with a relaxation oscillator disposed on the integrated circuit die and operating at a natural frequency thereof;

determining a ratio value by counting the number of cycles of the relaxation oscillator frequency during at least one period of a reference clock frequency, wherein the ratio value is the relaxation oscillator frequency divided by the reference clock frequency; and determining a reliable operating speed of the integrated circuit from the ratio value.

2. A method for determining a range of reliable operating speeds of a semiconductor integrated circuit die when operated over a range of voltages and temperatures, said method comprising the steps of:

(a) maintaining an initial temperature value on an integrated circuit die;

(b) applying an initial voltage value to the integrated circuit die;

(c) generating a frequency with a relaxation oscillator disposed on the integrated circuit die and operating at a natural frequency thereof;

(d) measuring the relaxation oscillator frequency;

(e) storing the relaxation oscillator frequency along with the temperature and voltage values at which the relaxation oscillator frequency was measured; and (f) incrementally changing the temperature in step (a) and the voltage in step (b) to a different temperature and voltage value, respectively, then repeating steps (c) through (e) until each relaxation oscillator frequency taken at each temperature and voltage is measured and stored at step (e).

3. The method of claim 2, further comprising the steps of:

measuring the relaxation oscillator frequencies for each of a plurality of integrated circuit dice;

determining a range of reliable operating speeds for each of the plurality of integrated circuit dice; and grading each of the plurality of integrated circuit dice according to the range of reliable operating speeds.

4. The method of claim 2, further comprising the steps of:

measuring the relaxation oscillator frequencies for each of a plurality of integrated circuit dice;

determining a range of reliable operating speeds for each of the plurality of integrated circuit dice; and matching each one of the plurality of integrated circuit dice with other ones of the plurality of integrated circuit dice according to the range of reliable operating speeds.

5. A method for operating a digital system having a plurality of semiconductor integrated circuits at an optimal clock speed, comprising the steps of:

generating a plurality of frequencies with a plurality of relaxation oscillators, each one of the plurality of relaxation oscillators being disposed on a respective one of a plurality of integrated circuits and operating at a natural frequency thereof;

measuring the plurality of frequencies;

determining a lowest one of the plurality of frequencies measured, wherein the lowest one is representative of the slowest integrated circuit having the lowest natural frequency; and adjusting the digital system clock so as to reliably run the slowest integrated circuit with the remaining plurality of integrated circuits in the digital system.

6. A method for minimizing the power required for a digital system having a plurality of semiconductor integrated circuits, comprising the steps of:

generating a plurality of frequencies with a plurality of relaxation oscillators, each one of the plurality of relaxation oscillators being disposed on a respective one of a plurality of integrated circuits and operating at a natural frequency thereof;

measuring the plurality of frequencies;

determining a lowest one of the plurality of frequencies measured, wherein the lowest one is representative of a slowest one of the plurality of integrated circuits and having the lowest natural frequency thereof; and adjusting the operating voltage on the slowest one of the plurality of integrated circuits so that the slowest one of the plurality of integrated circuits reliably runs at a desired system clock frequency.

7. The method of claim 6, further comprising the step of adjusting the operating voltage on at least one other of the plurality of integrated circuits to a minimum value that will reliably operate the at least one other at the desired system clock frequency, and thereby reducing the power used by the at least one other.

8. A method for optimizing the speed of a digital system having a plurality of semiconductor integrated circuits, comprising the steps of:

generating a plurality of frequencies with a plurality of relaxation oscillators, at least one of the plurality of relaxation oscillators being disposed on a respective one of a plurality of integrated circuits and operating at a natural frequency thereof;

measuring the plurality of frequencies;

determining from the plurality of frequencies measured the natural frequencies of each one of the plurality of integrated circuits; and adjusting the temperatures of the respective ones of the plurality of integrated circuits having natural frequencies below a predetermined value so as to raise their natural frequencies such that these respective ones will reliably operate at a desired system clock frequency.

9. A digital system having a plurality of semiconductor integrated circuits operating at an optimized clock speed for reliable operation, said system comprising:

a plurality of integrated circuits each having a relaxation oscillator disposed thereon and operating at a natural frequency thereof;

at least one frequency measurement circuit, said at least one frequency measurement circuit measuring the frequencies of the plurality of relaxation oscillators of said plurality of integrated circuits;

a frequency comparator circuit that compares the measured frequencies of the plurality of relaxation oscillators;

said frequency comparator circuit determining the lowest one of the measured relaxation oscillator frequencies and adjusting the frequency of a system clock so as to reliably run the slowest one of said plurality of integrated circuits with the other ones of said plurality of integrated circuits in the digital system.

10. The system of claim 9, further comprising a frequency multiplexer connected between said plurality of relaxation oscillators and said at least one frequency measurement circuit.

11. The system of claim 9, further comprising a temperature adjustment means for controlling the temperatures of said plurality of integrated circuits so that the digital system will reliably operate at a desired system clock frequency.

12. The system of claim 9, further comprising a voltage adjustment means for controlling the voltages of said plurality of integrated circuits so that the digital system will operate at a minimum power for a desired system clock frequency.

13. The system of claim 12, wherein said voltage adjustment means is a plurality of voltage adjustment means.

14. The system of claim 9, wherein said at least frequency measurement circuit is a frequency counter.

15. The system of claim 9, wherein said frequency comparator circuit is a digital microprocessor system including memory and input-output devices.

16. The system of claim 15, further comprising temperature and voltage sensors.

17. The system of claim 15, further comprising temperature and voltage controllers.

18. The system of claim 9, wherein said at least one frequency measurement circuit is a plurality of frequency measure circuits.

19. The system of claim 9, wherein said frequency comparator circuit is a microprocessor computer system having a look-up table in memory of the characteristics of the plurality of integrated circuits.

20. A method of grading a semiconductor integrated circuit according to its operating speed performance over a range of operating temperatures and voltages, comprising the steps of:

measuring a natural frequency of a relaxation oscillator disposed on an integrated circuit under test;

measuring a temperature of the integrated circuit under test;

measuring a voltage of the integrated circuit under test;

determining an operating speed performance for the integrated circuit under test from the measured natural frequency; and grading the integrated circuit under test according to its operating speed performance at the measured temperature and voltage.

21. The method of claim 20, further comprising the step of changing the temperature and then measuring the natural frequency again.

22. The method of claim 20, further comprising the step of changing the voltage and then measuring the natural frequency again.

23. A method of grading a plurality of semiconductor integrated circuits according to their operating speed performances over a range of operating temperatures and voltages, comprising the steps of:

measuring a plurality of natural frequencies of a plurality of relaxation oscillators disposed on a plurality of integrated circuits under test;

measuring a temperature of the plurality of integrated circuits under test;

measuring a voltage of the plurality of integrated circuits under test;

determining a plurality of operating speed performances for the plurality of integrated circuits under test from the plurality of measured natural frequencies; and grading the plurality of integrated circuits under test according to their operating speed performances at the measured temperature and voltage.

24. The method of claim 23, further comprising the step of changing the temperature and then measuring the plurality of natural frequencies again.

25. The method of claim 23, further comprising the step of changing the voltage and then measuring the plurality of natural frequencies again.

26. The method of claim 23, further comprising the step of substantially matching the operating speed performances of some ones of the plurality of integrated circuits with the operating speed performances of some other ones of the plurality of integrated circuits.

27. A system of grading a plurality of semiconductor integrated circuits according to their operating speed performances over a range of operating temperatures and voltages, comprising:

means for measuring a plurality of natural frequencies of a plurality of relaxation oscillators disposed on a plurality of integrated circuits under test;

means for measuring a temperature of the plurality of integrated circuits under test;

means for measuring a voltage of the plurality of integrated circuits under test;

means for determining a plurality of operating speed performances for the plurality of integrated circuits under test from the plurality of measured natural frequencies; and means for grading the plurality of integrated circuits under test according to their operating speed performances at the measured temperature and voltage.

28. The method of claim 27, further comprising means for changing the temperature and then measuring the plurality of natural frequencies again.

29. The method of claim 27, further comprising means for changing the voltage and then measuring the plurality of natural frequencies again.

30. The method of claim 27, further comprising means for substantially matching the operating speed performances of some ones of the plurality of integrated circuits with the operating speed performances of some other ones of the plurality of integrated circuits.

31. A method for determining the relative operating temperature of at least one integrated circuit in a digital system, comprising the steps of:

measuring a natural frequency of a relaxation oscillator disposed on at least one integrated circuit in a digital system; and determining an operating temperature of the at least one integrated circuit by correlating the measured natural frequency of the relaxation oscillator disposed thereon with a predetermined set of natural frequencies taken at a predetermined set of temperatures.

32. A method for automatically and continuously sensing the relative operating speed performance of at least one integrated circuit in a digital system and adjusting the operating speed of the at least one integrated circuit for best reliable system performance, comprising the steps of:

measuring a natural frequency of a relaxation oscillator disposed on at least one integrated circuit in a digital system;

determining a maximum reliable operating speed of the at least one integrated circuit; and adjusting the digital system operating speed for best reliable performance of the at least one integrated circuit in the digital system.

33. The method of claim 32, further comprising the step of adjusting the temperature of the at least one integrated circuit for a desired reliable operating speed.

34. The method of claim 32, further comprising the step of adjusting the voltage on the at least one integrated circuit for a desired reliable operating speed.

35. The method of claim 32, further comprising the step of adjusting the voltage on at least one other integrated circuit so as to reduce the power consumption of the digital system.

36. A system for automatically and continuously sensing the relative operating speed performance of at least one integrated circuit in a digital system and adjusting the operating speed of the at least one integrated circuit for best reliable system performance, comprising:

means for measuring a natural frequency of a relaxation oscillator disposed on at least one integrated circuit in a digital system;

means for determining a maximum reliable operating speed of the at least one integrated circuit; and means for adjusting the digital system operating speed for best reliable performance of the at least one integrated circuit in the digital system.

37. The system of claim 36, further comprising means for adjusting the temperature of the at least one integrated circuit for a desired reliable operating speed.

38. The system of claim 36, further comprising means for adjusting the voltage on the at least one integrated circuit for a desired reliable operating speed.

39. The system of claim 36, further comprising means for adjusting the voltage on at least one other integrated circuit so as to reduce the power consumption of the digital system.

40. The system of claim 32, 36 or 31, wherein the digital system is a single chip module.

41. The system of claim 5, 6, 8, 9, 32, 36 or 31, wherein the digital system is a multi-chip module having at least one integrated circuit.

42. The system of claim 5, 6, 8, 9, 32, 36 or 31, wherein the digital system is a board level product having a plurality of integrated circuits on at least one printed wiring board.

43. The system of claim 5, 6, 8, 9, 32, 36 or 31, wherein the digital system is a box level system having a plurality if integrated circuits on at least one printed wiring board mounted into a box with a power source.

44. The system of claim 5, 6, 8, 9, 32, 36 or 31, wherein the digital system is selected from the group comprising personal computers, work stations, servers, minicomputers, mainframe computers and super computers.

45. The system of claim 5, 6, 8, 9, 32, 36 or 31, wherein the digital system is selected from the group comprising security systems, entertainment systems, data storage systems, data acquisition systems, telecommunications systems and satellite systems.

46. The system of claim 5, 6, 8, 9, 32, 36 or 31, wherein the digital system is selected from the group comprising digital video systems, digital audio systems, digital entertainment systems, direct broadcast digital video systems, and digital video cable systems.

47. The system of claim 5, 6, 8, 9, 32, 36 or 31, wherein the digital system is selected from the group comprising televisions, cameras, recorders, compact disc players/recorders, and digital tape players/recorders.

48. The system of claim 5, 6, 8, 9, 32, 36 or 31, wherein the digital system is selected from the group comprising cellular telephones, private branch exchange, telephone switching, video picture telephones, network controllers, encoders and decoders.

49. The system of claim 5, 6, 8, 9, 32, 36 or 31, wherein the digital system is selected from the group comprising control, monitoring and navigational systems for airplanes, trains, automobiles, helicopters, rockets, missiles, boats and submarines.

50. The system of claim 5, 6, 8, 9, 32, 36 or 31 wherein the digital system is a flat panel projected pixel display.

* * * * *